(12) United States Patent
Hara et al.

(10) Patent No.: US 9,063,415 B2
(45) Date of Patent: Jun. 23, 2015

(54) PHOTOCURABLE RESIN COMPOSITION AND NOVEL SILOXANE COMPOUND

(71) Applicant: ADEKA CORPORATION, Tokyo (JP)

(72) Inventors: Kenji Hara, Tokyo (JP); Tomoyuki Iwashima, Tokyo (JP); Jinichi Omi, Tokyo (JP); Seiichi Saito, Tokyo (JP)

(73) Assignee: ADEKA CORPORATION, Tokyo (JP)

( * ) Notice: Subject to any disclaimer, the term of this patent is extended or adjusted under 35 U.S.C. 154(b) by 0 days.

(21) Appl. No.: 14/342,792

(22) PCT Filed: Oct. 22, 2012

(86) PCT No.: PCT/JP2012/077207
§ 371 (c)(1),
(2) Date: Mar. 5, 2014

(87) PCT Pub. No.: WO2013/061908
PCT Pub. Date: May 2, 2013

(65) Prior Publication Data
US 2014/0205949 A1 Jul. 24, 2014

(30) Foreign Application Priority Data

Oct. 25, 2011 (JP) ................................. 2011-234284
Nov. 28, 2011 (JP) ................................. 2011-258776

(51) Int. Cl.
C08F 283/12 (2006.01)
C08J 3/28 (2006.01)
C08F 2/46 (2006.01)
C08G 61/04 (2006.01)
G03F 7/004 (2006.01)

(52) U.S. Cl.
CPC .................................... *G03F 7/0045* (2013.01)

(58) Field of Classification Search
CPC .................................................... G03F 7/0045
USPC ..................................... 522/99, 148, 1; 520/1
See application file for complete search history.

(56) References Cited

U.S. PATENT DOCUMENTS

| 6,624,236 B1 * | 9/2003 | Bissinger et al. ............. 524/588 |
| 2007/0205399 A1 * | 9/2007 | Mizori ......................... 252/500 |
| 2011/0070448 A1 | 3/2011 | Matsumura et al. |

FOREIGN PATENT DOCUMENTS

| JP | 09-048934 | 2/1997 |
| JP | 2000-191710 | 7/2000 |
| JP | 2003-292891 | 10/2003 |
| JP | 2008-216875 | 9/2008 |
| JP | 2009-036858 | 2/2009 |
| JP | 2009-277763 | 11/2009 |
| JP | 2010-101957 | 5/2010 |
| JP | 2010-285507 | 12/2010 |
| JP | 2011-012145 | 1/2011 |

OTHER PUBLICATIONS

International Search Report PCT/JP2012/077207 dated Nov. 20, 2012.

* cited by examiner

*Primary Examiner* — Ling Choi
*Assistant Examiner* — Jessica E Whiteley
(74) *Attorney, Agent, or Firm* — Young & Thompson

(57) ABSTRACT

Disclosed is a photocurable resin composition that is alkali-developable, provides a cured product having excellent adhesiveness and scratch resistance, and is useful as a hard-coat material for an image display surface of an image display device. Also disclosed is a novel siloxane compound that is useful as a resin component of the aforementioned photocurable resin composition. Specifically, the invention provides: a photocurable resin composition including (A) a polyol acrylate compound, (B) a compound including, in the molecule thereof, an acrylic or methacrylic group and a carboxyl group, (C) a siloxane compound represented by one of the general formulae (1) to (4), and (D) a photoradical generating agent; and a novel siloxane compound represented by the general formula (4). The specific contents of the general formulae (1) to (4) are as described in the Description.

3 Claims, No Drawings

PHOTOCURABLE RESIN COMPOSITION AND NOVEL SILOXANE COMPOUND

TECHNICAL FIELD

The present invention relates to a photocurable resin composition that is alkali-developable and that can form a cured product having excellent adhesiveness, scratch resistance, and transparency, and a novel siloxane compound that is useful as a resin component of the aforementioned photocurable resin composition.

BACKGROUND ART

The image display surface of an image display device, such as a liquid crystal display, a CRT display, a projection display, a plasma display, or an electroluminescent display, needs to be provided with scratch resistance such that no scratches will be made during handling. In general, scratch resistance is improved by forming a hard-coat layer on the image display surface. Because acrylate compounds can be cured in a short time by using photoradical generating agents, photocurable compositions including polyfunctional acrylates as main components are used as hard-coat materials. Of various polyfunctional acrylates, photocurable compositions particularly including dipentaerythritol hexaacrylate as a main component (see, for example, Patent Documents 1 and 2) can provide a hard-coat layer with a high surface hardness and excellent scratch resistance; however, adhesiveness to glass, etc., is insufficient. A photocurable composition that includes, as a main component, a hydroxyl-group-containing acrylate such as pentaerythritol triacrylate (see, for example, Patent Document 3) is known as a composition with improved adhesiveness to glass. This composition, however, has a drawback in that the surface hardness is insufficient and that it is prone to scratches. It is also known that a photocurable composition including an epoxycyclohexyl-group-containing siloxane compound and a radical-curable acrylic resin (see, for example, Patent Document 4) can provide a hard-coat layer having excellent scratch resistance; however, adhesiveness to glass is insufficient.

Meanwhile, in order to form a hard-coat layer only on the image display surface, it is preferable to use a photoresist. Further, in consideration of effects on health and the environment, it is preferable to use an alkali-developable photoresist. Alkali-developable photoresists that can be used for hard-coat layers are known in the art (see, for example, Patent Document 5), but such known photoresists have insufficient scratch resistance.

CITATION LIST

Patent Literature

Patent Document 1: JP-A-9-48934
Patent Document 2: JP-A-2011-12145
Patent Document 3: JP-A-2000-191710
Patent Document 4: JP-A-2003-292891
Patent Document 5: JP-A-2008-216875

SUMMARY OF INVENTION

Technical Problem

An objective of the present invention is to provide a photocurable resin composition that is alkali-developable, provides a cured product having excellent adhesiveness and scratch resistance, and is useful as a hard-coat material for an image display surface of an image display device, and a novel siloxane compound that is useful as a resin component of the aforementioned photocurable resin composition.

Solution to Problem

As a result of diligent research, Inventors have found that the aforementioned objective can be achieved by blending a siloxane compound having a specific structure, thus achieving the present invention.

That is, the invention provides a photocurable resin composition including (A) a polyol acrylate compound, (B) a compound including, in the molecule thereof, an acrylic or methacrylic group and a carboxyl group, (C) a siloxane compound represented by one of the following general formulae (1) to (4), and (D) a photoradical generating agent:

[Chemical Formula 1]

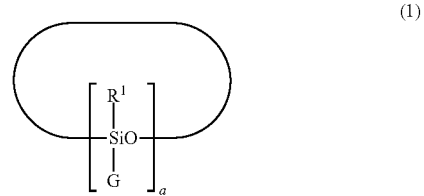

(1)

wherein $R^1$ represents a $C_{1-4}$ alkyl group or a $C_{6-10}$ aryl group which may be the same as or different from one another; G represents a substituent having a glycidyl group; and a represents a number from 3 to 6,

[Chemical Formula 2]

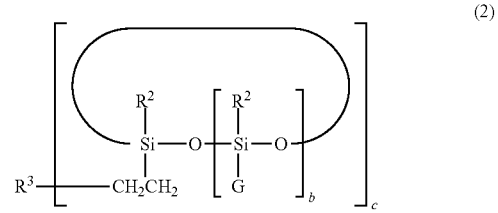

(2)

wherein $R^2$ represents a $C_{1-4}$ alkyl group or a $C_{6-10}$ aryl group which may be the same as or different from one another; $R^3$ represents a residue in which vinyl groups have been removed from a compound having two to four vinyl groups in a single molecule and having a molecular weight of 1000 or less; G represents a substituent having a glycidyl group; b represents a number from 2 to 5; and c represents a number from 2 to 4,

[Chemical Formula 3]

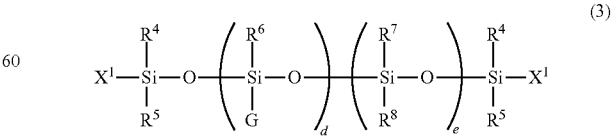

(3)

wherein $R^4$ to $R^8$ each represent a $C_{1-4}$ alkyl group or a $C_{6-10}$ aryl group which may be the same as or different from one another; G represents a substituent having a glycidyl group;

$X^1$ represents a methyl group or a substituent having a glycidyl group; d represents a number from 0 to 100; and e represents a number from 0 to 100; wherein if d is 0 or 1, $X^1$ represents a substituent having a glycidyl group,

[Chemical Formula 4]

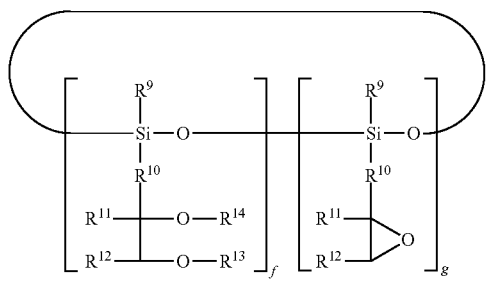

(4)

wherein $R^9$ represents a $C_{1-4}$ alkyl group or a $C_{6-10}$ aryl group; $R^{11}$ represents a hydrogen atom or a methyl group; $R^{13}$ represents an acrylic group or a methacrylic group; $R^{14}$ represents a hydrogen atom, an acrylic group, a methacrylic group, or a residue in which one hydroxyl group has been removed from a dibasic acid; $R^{10}$ and $R^{12}$ may be bonded; if $R^{10}$ and $R^{12}$ are not bonded, $R^{10}$ represents a $C_{2-10}$ divalent linking group, and $R^{12}$ represents a hydrogen atom or a methyl group; if $R^{10}$ and $R^{12}$ are bonded, $R^{10}$ represents a trivalent or tetravalent linking group, and $R^{12}$ represents a methylene group or a methine group; f represents a number from 1 to 6; and g represents a number from 0 to 5 that makes f+g take a number from 3 to 6.

The present invention also provides a novel siloxane compound represented by the aforementioned general formula (4).

Advantageous Effects of Invention

An effect of the present invention is the provision of a photocurable resin composition that is alkali-developable, provides a cured product having excellent adhesiveness and scratch resistance, and is useful as a hard-coat material for an image display surface of an image display device.

DESCRIPTION OF EMBODIMENTS

The present invention will be described in detail below. It should be noted that in the present invention, a compound having an acrylic group or a methacrylic group may be referred to as an acrylate compound, and an oligomer obtained from acrylic acid or methacrylic acid, or an oligomer obtained from a monomer composition including acrylic acid or methacrylic acid, may be referred to as an acrylic-acid-based oligomer.

The photocurable resin composition of the present invention includes (A) a polyol acrylate compound, (B) a compound including, in the molecule thereof, an acrylic or methacrylic group and a carboxyl group, (C) a siloxane compound represented by one of the aforementioned general formulae (1) to (4), and (D) a photoradical generating agent. It should be noted that in the present invention, the acrylic group and the methacrylic group may be referred to collectively as a (meth)acrylic group, acrylic acid and methacrylic acid may be referred to collectively as (meth)acrylic acid, and acrylate and methacrylate may be referred to collectively as (meth)acrylate.

First, component (A) of the present invention—i.e., the polyol acrylate compound—will be explained. The polyol acrylate compound of component (A) refers to a (meth)acrylic acid ester of a compound having at least two hydroxyl groups in its molecule. The two or more hydroxyl groups of the polyol may all be esterified, or a portion thereof may be esterified with the rest remaining as-is as hydroxyl group(s). Examples of polyol acrylate compounds include the following compounds.

(Meth)acrylate compounds of divalent alcohols, such as ethylene glycol di(meth)acrylate, diethylene glycol di(meth)acrylate, triethylene glycol di(meth)acrylate, propylene glycol di(meth)acrylate, dipropylene glycol di(meth)acrylate, tripropylene glycol di(meth)acrylate, 1,3-butanediol di(meth)acrylate, 1,4-butanediol di(meth)acrylate, 1,5-pentanediol di(meth)acrylate, isoprene glycol di(meth)acrylate, 1,6-hexanediol di(meth)acrylate, neopentyl glycol di(meth)acrylate, octanediol di(meth)acrylate, 1,2-cyclohexanediol di(meth)acrylate, 1,4-cyclohexanediol di(meth)acrylate, hydrogenated bisphenol-A di(meth)acrylate, ethoxylated bisphenol-A di(meth)acrylate, and propoxylated bisphenol-A di(meth)acrylate.

(Meth)acrylate compounds of trivalent alcohols, such as glycerol di(meth)acrylate, glycerol tri(meth)acrylate, trimethylol ethane di(meth)acrylate, trimethylol ethane tri(meth)acrylate, trimethylol propane di(meth)acrylate, trimethylol propane tri(meth)acrylate, and tris[(meth)acryloxyethyl]isocyanurate.

(Meth)acrylate compounds of tetravalent alcohols, such as erythritol tri(meth)acrylate, erythritol tetra(meth)acrylate, pentaerythritol tri(meth)acrylate, pentaerythritol tetra(meth)acrylate, diglycerol tri(meth)acrylate, diglycerol tetra(meth)acrylate, ditrimethylol propane tri(meth)acrylate, and ditrimethylol propane tetra(meth)acrylate; (meth)acrylate compounds of pentavalent alcohols, such as triglycerol tetra(meth)acrylate and triglycerol penta(meth)acrylate; and (meth)acrylate compounds of hexavalent alcohols, such as dipentaerythritol penta(meth)acrylate and dipentaerythritol hexa(meth)acrylate.

It is preferable that the component (A) of the photocurable resin composition of the present invention is a (meth)acrylate compound of a tetravalent to hexavalent alcohol, more preferably a (meth)acrylate compound of a pentavalent to hexavalent alcohol, and even more preferably dipentaerythritol hexaacrylate, because the deterioration of scratch resistance is small.

Next, component (B) of the present invention—i.e., the compound including, in its molecule, an acrylic or methacrylic group and a carboxyl group—will be explained.

In the present invention, a compound including an acrylic or methacrylic group and a carboxyl group refers to a compound that includes, in a single molecule, at least one acrylic group or methacrylic group and at least one carboxyl group. Examples of compounds including an acrylic or methacrylic group and a carboxyl group include: glycidyl-modified acrylate compounds of acrylic-acid-based oligomers, isocyanate-modified acrylate compounds of acrylic-acid-based oligomers, and acid-pendant-type epoxy acrylate compounds; however, acid-pendant-type epoxy acrylate compounds are preferred because of good alkali-developability and good adhesiveness of the cured product. An epoxy acrylate compound refers to a compound obtained by reacting acrylic acid or methacrylic acid with the epoxy group in an epoxy compound—i.e., a compound in which the epoxy group undergoes a ring-opening reaction with acrylic acid or methacrylic acid and in which an acroyl or methacroyl group and a hydroxyl group have been produced. Further, in the present invention, an acid-pendant-type epoxy acrylate compound refers to an acid partial ester of an epoxy acrylate compound and a polycarboxylic acid.

It is preferable that the component (B) of the present invention is a compound having a partial structure represented by the following general formula (5), because of excellent adhesiveness of the cured product and because the deterioration of scratch resistance is small,

[Chemical Formula 5]

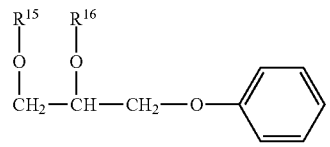

(5)

wherein $R^{15}$ represents an acrylic group or a methacrylic group, and $R^{16}$ represents a residue in which one hydroxyl group has been removed from a dibasic acid.

In the aforementioned general formula (5), $R^{15}$ represents an acrylic group or a methacrylic group, and $R^{16}$ represents a residue in which one hydroxyl group has been removed from a dibasic acid. Examples of dibasic acids used for the residue, in which one hydroxyl group has been removed from a dibasic acid, include: aliphatic saturated dibasic acids, such as oxalic acid, malonic acid, succinic acid, glutaric acid, and adipic acid; aliphatic unsaturated dibasic acids, such as fumaric acid, maleic acid, and itaconic acid; aromatic dibasic acids, such as phthalic acid, isophthalic acid, terephthalic acid, and naphthalene dicarboxylic acid; and alicyclic dibasic acids, such as 1,2-cyclohexyl dicarboxylic acid, 1,3-cyclohexyl dicarboxylic acid, 1,4-cyclohexyl dicarboxylic acid, 1,2,3,6-tetrahydrophthalic acid, and 3,4,5,6-tetrahydrophthalic acid.

Among these dibasic acids, succinic acid, maleic acid, phthalic acid, 1,2-cyclohexyl dicarboxylic acid, 1,2,3,6-tetrahydrophthalic acid, 3,4,5,6-tetrahydrophthalic acid, 3- or 4-methyl-1,2,3,6-tetrahydrophthalic acid, 3- or 4-methyl-1,2-cyclohexyl dicarboxylic acid, 3,6-endomethylene-1,2,3,6-tetrahydrophthalic acid, and 3- or 4-3,6-endomethylene-1,2,3,6-tetrahydrophthalic acid are preferable because of excellent material reactivity; and phthalic acid, 1,2-cyclohexyl dicarboxylic acid, 1,2,3,6-tetrahydrophthalic acid, and 3,4,5,6-tetrahydrophthalic acid are more preferable because cured products having high hardness can be obtained.

The compound having a partial structure represented by the aforementioned general formula (5) is an acid-pendant-type epoxy acrylate compound synthesized from a glycidyl ether of a compound having (a) phenolic hydroxyl group(s). Preferred compounds having (a) phenolic hydroxyl group(s) include compounds having at least two phenolic hydroxyl groups in a single molecule, including, for example, 1,2-benzenediol, 1,3-benzenediol, 1,4-benzenediol, 1,2-naphthalenediol, 1,3-naphthalenediol, 1,4-naphthalenediol, 1,5-naphthalenediol, 1,6-naphthalenediol, 1,7-naphthalenediol, 1,8-naphthalenediol, 2,3-naphthalenediol, 2,4-naphthalenediol, 2,5-naphthalenediol, 2,6-naphthalenediol, 2,7-naphthalenediol, phenol novolac, naphthol novolac, naphthol-phenol cocondensed novolac, cresol novolac, 4-hydroxystyrene oligomer, compounds represented by the following formula (6), and bisphenol compounds represented by the following general formula (7). Among the above, bisphenol compounds represented by the following general formula (7) are preferable because the deterioration of scratch resistance is small,

[Chemical Formula 6]

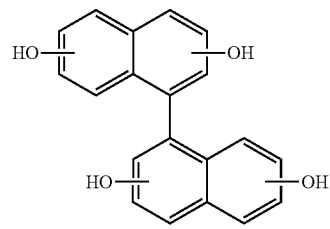

(6)

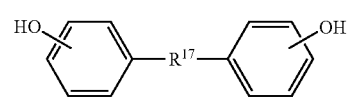

(7)

wherein $R^{17}$ represents an oxygen atom, a sulfur atom, a sulfinyl group, a sulfone group, a $C_{1-15}$ divalent hydrocarbon group, or a direct bond.

In the aforementioned general formula (7), $R^{17}$ represents an oxygen atom, a sulfur atom, a sulfinyl group, a sulfone group, a $C_{1-15}$ divalent hydrocarbon group, or a direct bond. Examples of $C_{1-15}$ divalent hydrocarbon groups include methylene, ethylidene, propylidene, isopropylidene, butylidene, isobutylidene, 1-methylpropylidene, 1-methylpentylidene, 1-methyloctylidene, 1-methyldecylidene, phenylmethylene, cyclohexylidene [formula (8) below], 3,3,5-trimethylcyclohexylidene [formula (9) below], octahydro-4,7-methano-5H-inden-5-ylidene [formula (10) below], 9H-fluoren-9-ylidene [formula (11) below], indan-1-ylidene [formula (12) below], 3-phenylindan-1-ylidene [formula (13) below], phenylene bis(isopropylidene) [formula (14) below], and the group represented by formula (15) below.

[Chemical Formula 7]

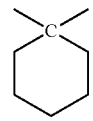

(8)

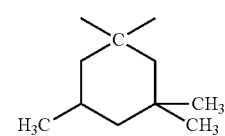

(9)

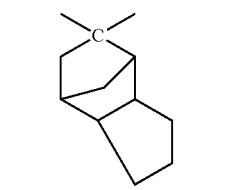

(10)

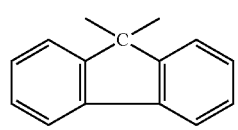

(11)

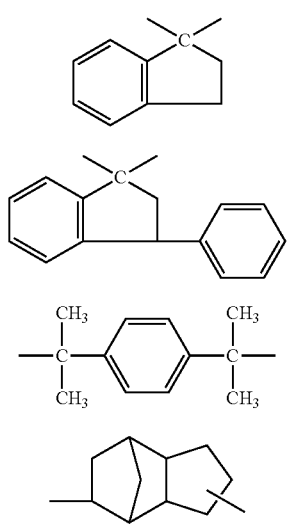

(12)

(13)

(14)

(15)

It is preferable that $R^{17}$ is an aromatic-ring-containing divalent hydrocarbon group, more preferably 9H-fluoren-9-ylidene, indan-1-ylidene, 3-phenylindan-1-ylidene, or phenylene bis(isopropylidene), because the deterioration of scratch resistance is small.

In the photocurable resin composition of the present invention, alkali-developability will be insufficient if the content of component (B) is too small, and scratch resistance will deteriorate if the content is too large. Thus, the content of component (B) is preferably 1 to 60 parts by mass, more preferably 3 to 30 parts by mass, and even more preferably 7 to 18 parts by mass, with respect to a total of 100 parts by mass of component (A) and component (C).

The compound having a partial structure represented by the aforementioned general formula (5) can be obtained by: reacting acrylic acid or methacrylic acid with the epoxy group in a compound having the partial structure represented by the following formula (5a) to obtain a compound having a partial structure represented by the following general formula (5b); and reacting a dibasic acid or a dibasic acid anhydride with the hydroxyl group in the compound having a partial structure represented by the following general formula (5b). In the reaction between a compound having a partial structure represented by the following general formula (5b) and a dibasic acid or a dibasic acid anhydride, it is preferable to use a dibasic acid anhydride because reaction is possible under relatively mild conditions, The reaction between a compound having the partial structure represented by the aforementioned formula (5a) and (meth)acrylic acid, as well as the reaction between the reaction between a compound having a partial structure represented by the aforementioned general formula (5b) and a dibasic acid or a dibasic acid anhydride, may be performed without a catalyst, but it is preferable to use a catalyst because the reaction proceeds smoothly. Examples of reaction catalysts include: organophosphorus catalysts, such as triphenylphosphine, tributylphosphine, tri(4-methylphenyl)phosphine, and tri(nonylphenyl)phosphine; imidazole-based catalysts, such as imidazole, 2-methylimidazole, 2,4-dimethylimidazole, 2-ethyl-4-methylimidazole, and 2-phenylimidazole; and tertiary amine-based catalysts, such as triethylamine, trimethylenediamine, benzyldimethylamine, and 1,8-diazabicyclo[5,4,0]undecene-7. However, it is preferable to use an organophosphorus catalyst. The amount of reaction catalyst added is preferably 3 mass % or less of the total amount of the various materials, more preferably 0.0001 to 1 mass %, and even more preferably 0.001 to 0.1 mass %. The reaction temperature is generally from 50 to 150° C., and preferably from 70 to 120° C.

Next, component (C) of the present invention—i.e., the siloxane compound represented by one of the aforementioned general formulae (1) to (4)—will be explained.

First, the siloxane compound represented by the aforementioned general formula (1) will be explained. In general formula (1), $R^1$ represents a $C_{1-4}$ alkyl group or a $C_{6-10}$ aryl group which may be the same as or different from one another. Examples of $C_{1-4}$ alkyl groups include the methyl group, ethyl group, propyl group, isopropyl group, butyl group, secondary butyl group, isobutyl group, and t-butyl group. Examples of $C_{6-10}$ aryl groups include the phenyl group, ethylphenyl group, tolyl group, cumenyl group, xylyl group, pseudocumenyl group, mesityl group, t-butylphenyl group, and phenethyl group. It is preferable that $R^1$ is a methyl group, ethyl group, or phenyl group, more preferably a methyl group or phenyl group, and even more preferably a methyl group, from the viewpoint of heat resistance.

G represents a substituent having a glycidyl group. Examples of substituents having a glycidyl group include groups represented by the following formulae (16) to (23). The 3,4-epoxy butyl group [formula (16)], 3-glycidoxypropyl group [formula (21)], and 2-glycidoxycarboxyethyl group [formula (22)] are preferable, and the 3-glycidoxypropyl group is more preferable, because cured products having excellent adhesiveness can be obtained.

[Chemical Formula 8]

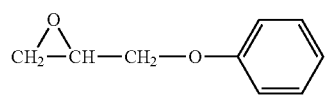

(5a)

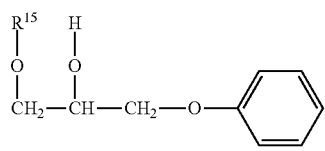

(5b)

wherein $R^{15}$ is as defined in the aforementioned general formula (5).)

[Chemical Formula 9]

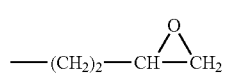

(16)

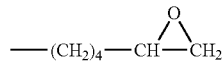

(17)

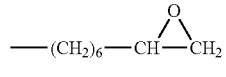

(18)

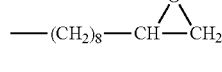

(19)

-continued

(20)
—(CH$_2$)$_2$—O—CH$_2$—CH—CH$_2$ (with epoxide O)

(21)
—(CH$_2$)$_3$—O—CH$_2$—CH—CH$_2$ (with epoxide O)

(22)
—CH$_2$CH$_2$—CO$_2$—CH$_2$—CH—CH$_2$ (with epoxide O)

(23)
—CH$_2$CH(CH$_3$)—CO$_2$—CH$_2$—CH—CH$_2$ (with epoxide O)

The letter "a" represents a number from 3 to 6. From the viewpoint of easy industrial availability of materials, "a" is preferably a number from 3 to 5, more preferably a number from 3 to 4, and even more preferably 4.

If the substituent having a glycidyl group in the siloxane compound represented by the aforementioned general formula (1) is a group represented by one of the aforementioned formulae (16) to (23), a compound represented by one of the following formulae (16a) to (23a) may be subjected to a hydrosilylation reaction with an SiH group in a cyclic siloxane compound represented by the following general formula (1a),

[Chemical Formula 10]

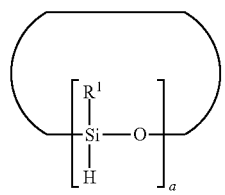

(1a)

wherein R$^1$ and a are as defined in the aforementioned general formula (1).

[Chemical Formula 11]

(16a)
CH$_2$=CH—CH—CH$_2$ (with epoxide O)

(17a)
CH$_2$=CH—(CH$_2$)$_2$—CH—CH$_2$ (with epoxide O)

(18a)
CH$_2$=CH—(CH$_2$)$_4$—CH—CH$_2$ (with epoxide O)

(19a)
CH$_2$=CH—(CH$_2$)$_6$—CH—CH$_2$ (with epoxide O)

(20a)
CH$_2$=CH—O—CH$_2$—CH—CH$_2$ (with epoxide O)

(21a)
CH$_2$=CHCH$_2$—O—CH$_2$—CH—CH$_2$ (with epoxide O)

(22a)
CH$_2$=CH—CO$_2$—CH$_2$—CH—CH$_2$ (with epoxide O)

(23a)
CH$_2$=C(CH$_3$)—CO$_2$—CH$_2$—CH—CH$_2$ (with epoxide O)

The hydrosilylation reaction between a compound represented by the aforementioned general formula (1a) and a compound represented by one of the aforementioned formulae (16a) to (23a) may be performed by using a platinum catalyst. Examples of platinum catalysts include chloroplatinic acid, complexes of chloroplatinic acid and alcohols, aldehydes, ketones or the like, platinum-olefin complexes, a platinum-carbonylvinylmethyl complex (Ossko catalyst), a platinum-divinyltetramethyldisiloxane complex (Karstedt catalyst), a platinum-cyclovinylmethylsiloxane complex, a platinum-octylaldehyde complex, platinum-phosphine complexes (for example, Pt[P(C$_6$H$_5$)$_3$]$_4$, PtCl[P(C$_6$H$_5$)$_3$]$_3$, Pt[P(C$_4$H$_9$)$_3$]$_4$], platinum-phosphite complexes (for example, Pt[P(OC6H$_5$)$_3$]$_4$), Pt[P(OC$_4$H$_9$)$_3$]$_4$), dicarbonyldichloroplatinum, and the like. Examples of palladium catalysts or rhodium catalysts include compounds including a palladium atom or a rhodium atom instead of the platinum atom in the aforementioned platinum catalysts. The catalyst may be used singly, or two or more types of catalysts may be used in combination. It is preferable that the hydrosilylation catalyst is a platinum catalyst, more preferably a platinum-divinyltetramethyldisiloxane complex or platinum-carbonylvinylmethyl complex, and even more preferably a platinum-carbonylvinylmethyl complex, from the viewpoint of reactivity. Furthermore, the amount of catalyst added is preferably 5 mass % or less, more preferably from 0.0001 to 1 mass %, and even more preferably from 0.001 to 0.1 mass % of the total amount of the various materials, from the viewpoint of reactivity. Although the reaction conditions for the hydrosilylation are not specifically limited and hydrosilylation may be conducted under conventionally known conditions by using the aforementioned catalyst(s), it is preferable to conduct hydrosilylation in a range from room temperature (25° C.) to 130° C. from the viewpoint of reaction speed. A conventionally known solvent, such as toluene, hexane, methyl isobutyl ketone, cyclopentanone, or propylene glycol monomethyl ether acetate, may be used during the reaction.

Next, the siloxane compound represented by the aforementioned general formula (2) will be explained. In general formula (2), R$^2$ represents a C$_{1-4}$ alkyl group or a C$_{6-10}$ aryl group which may be the same as or different from one another. Examples of C$_{1-4}$ alkyl groups and C$_{6-10}$ aryl groups include groups given as examples for R$^1$ in the aforementioned general formula (1). G is the same as in the aforementioned general formula (1). The letter "b" represents a number from 2 to 5. From the viewpoint of easy industrial availability of materials, "b" is preferably a number from 2 to 4, more preferably a number from 2 to 3, and even more preferably 3.

In the aforementioned general formula (2), R$^3$ represents a residue in which vinyl groups have been removed from a compound having two to four vinyl groups in a single molecule and having a molecular weight of 1000 or less. Examples of compounds having two to four vinyl groups and having a molecular weight of 1000 or less include hydrocarbon compounds having two to four vinyl groups, silane compounds or siloxane compounds having two to four vinyl groups, and isocyanurates having two or three vinyl groups.

Concrete examples of such compounds include compounds represented by the following general formulae (24) to (30). From the viewpoint of heat resistance, compounds represented by the following general formulae (24) to (26) are preferable. From the viewpoint of easy industrial availability, compounds represented by the following general formula (28) are preferable. Further, the number of vinyl groups in the aforementioned compound having two to four vinyl groups in a single molecule is preferably two, because resist residues of the photocurable resin composition of the present invention are less prone to remain,

[Chemical Formula 12]

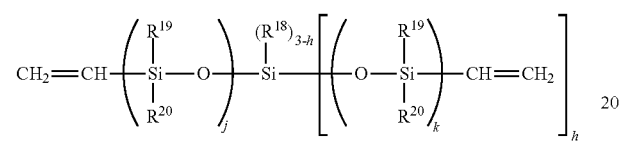
(24)

wherein $R^{18}$ to $R^{20}$ each independently represent a $C_{1-4}$ alkyl group or a $C_{6-10}$ aryl group; h represents a number from 1 to 3; and j and k each independently represent a number from 0 to 6,

[Chemical Formula 13]

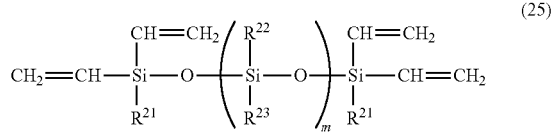
(25)

wherein $R^{21}$ to $R^{23}$ each independently represent a $C_{1-4}$ alkyl group or a $C_{6-10}$ aryl group; and m represents a number from 0 to 10,

[Chemical Formula 14]

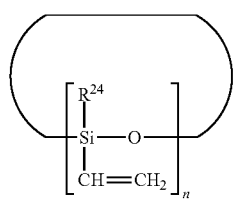
(26)

wherein $R^{24}$ independently represents a $C_{1-4}$ alkyl group or a $C_{6-10}$ aryl group; and n represents a number of either 3 or 4,

[Chemical Formula 15]

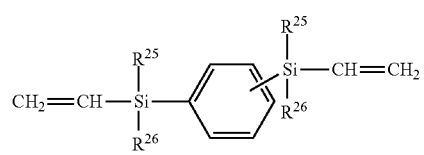
(27)

wherein $R^{25}$ and $R^{26}$ each independently represent a $C_{1-4}$ alkyl group or a $C_{6-10}$ aryl group,

[Chemical Formula 16]

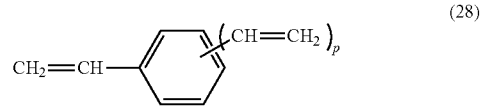
(28)

wherein p represents a number from 1 to 2,

[Chemical Formula 17]

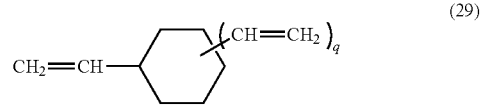
(29)

wherein q represents a number from 1 to 3,

[Chemical Formula 18]

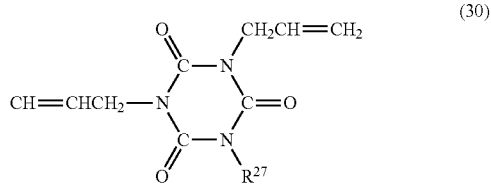
(30)

wherein $R^{27}$ represents a $C_{1-4}$ alkyl group, a $C_{6-10}$ aryl group, a glycidyl group, or an allyl group.

A compound represented by the aforementioned general formula (24) is a compound having two to four vinyl groups in a single molecule. In the aforementioned general formula (24), $R^{18}$ to $R^{20}$ each independently represent a $C_{1-4}$ alkyl group or a $C_{6-10}$ aryl group. Examples of $C_{1-4}$ alkyl groups and $C_{6-10}$ aryl groups include groups given as examples for $R^1$ in the aforementioned general formula (1); the methyl group, ethyl group, propyl group, and phenyl group are preferable, the methyl group, ethyl group, and phenyl group are more preferable, and the methyl group is even more preferable, because of good heat resistance. The letter "h" represents a number from 1 to 3, and j and k each independently represent a number from 0 to 6.

Preferable compounds among compounds represented by the aforementioned general formula (24) wherein h is 1 include dimethyldivinylsilane, diethyldivinylsilane, diphenyldivinylsilane, 1,1,3,3-tetramethyl-1,3-divinyldisiloxane, 1,1,3,3-tetraethyl-1,3-divinyldisiloxane, and 1,1,3,3-tetraphenyl-1,3-divinyldisiloxane. Among the above, dimethyldivinylsilane, diethyldivinylsilane, diphenyldivinylsilane, and 1,1,3,3-tetramethyl-1,3-divinyldisiloxane are preferable, and 1,1,3,3-tetramethyl-1,3-divinyldisiloxane is more preferable.

Preferable compounds among compounds represented by the aforementioned general formula (24) wherein h is 2 include methyltrivinylsilane, ethyltrivinylsilane, phenyltrivinylsilane, 1,1,3,5,5-pentamethyl-1,3,5-trivinyltrisiloxane, 1,1,5,5-tetramethyl-3-phenyl-1,3,5-trivinyltrisiloxane, tris(dimethylvinylsiloxy)methylsilane, and tris(dimethylvinylsiloxy)phenylsilane.

Preferable compounds among compounds represented by the aforementioned general formula (24) wherein h is 3 include tetravinylsilane and tetrakis(dimethylvinylsiloxy)silane.

A compound represented by the aforementioned general formula (25) is a compound having four vinyl groups in a single molecule. In the aforementioned general formula (25), $R^{21}$ to $R^{23}$ each independently represent a $C_{1-4}$ alkyl group or a $C_{6-10}$ aryl group. Examples of $C_{1-4}$ alkyl groups and $C_{6-10}$ aryl groups include groups given as examples for $R^1$ in the aforementioned general formula (1); the methyl group, ethyl group, propyl group, and phenyl group are preferable, the methyl group, ethyl group, and phenyl group are more preferable, and the methyl group is even more preferable, because of good heat resistance.

The letter "m" represents a number from 0 to 10.

Preferable compounds among compounds represented by the aforementioned general formula (25) include 1,3-dimethyl-1,1,3,3-tetravinyldisiloxane, 1,3,3,5-tetramethyl-1,1,5,5-tetravinyltrisiloxane, and 1,5-dimethyl-3,3-diphenyl-1,1,5,5-tetravinyltrisiloxane.

A compound represented by the aforementioned general formula (26) is a compound having three to four vinyl groups in a single molecule. In the aforementioned general formula (26), $R^{24}$ independently represents a $C_{1-4}$ alkyl group or a $C_{6-10}$ aryl group. Examples of $C_{1-4}$ alkyl groups and $C_{6-10}$ aryl groups include groups given as examples for $R^1$ in the aforementioned general formula (1); the methyl group, ethyl group, propyl group, and phenyl group are preferable, the methyl group, ethyl group, and phenyl group are more preferable, and the methyl group is even more preferable, because of good heat resistance.

The letter "n" represents a number of 3 or 4, and 4 is preferable from the viewpoint of easy industrial availability.

Preferable compounds among compounds represented by the aforementioned general formula (26) wherein n is 3 include 2,4,6-trimethyl-2,4,6-trivinylcyclotrisiloxane, 2,4,6-triethyl-2,4,6-trivinylcyclotrisiloxane, 2,4,6-triphenyl-2,4,6-trivinylcyclotrisiloxane, and 2,4-dimethyl-6-phenyl-2,4,6-trivinylcyclotrisiloxane.

Preferable compounds among compounds represented by the aforementioned general formula (26) wherein n is 4 include 2,4,6,8-tetramethyl-2,4,6,8-tetravinylcyclotrisiloxane, 2,4,6,8-tetraethyl-2,4,6,8-tetravinylcyclotrisiloxane, 2,4,6,8-tetraphenyl-2,4,6,8-tetravinylcyclotrisiloxane, 2,4,6-trimethyl-8-phenyl-2,4,6,8-tetravinylcyclotrisiloxane, and 2,4-dimethyl-6,8-diphenyl-2,4,6,8-tetravinylcyclotrisiloxane.

A compound represented by the aforementioned general formula (27) is a compound having two vinyl groups in a single molecule. In the aforementioned general formula (27), $R^{25}$ and $R^{26}$ each independently represent a $C_{1-4}$ alkyl group or a $C_{6-10}$ aryl group. Examples of $C_{1-4}$ alkyl groups and $C_{6-10}$ aryl groups include groups given as examples for $R^1$ in the aforementioned general formula (1); the methyl group, ethyl group, propyl group, and phenyl group are preferable, the methyl group, ethyl group, and phenyl group are more preferable, and the methyl group is even more preferable, because of good heat resistance.

Preferable compounds among compounds represented by the aforementioned general formula (27) include 1,2-bis(dimethylvinylsilyl)benzene, 1,3-bis(dimethylvinylsilyl)benzene, 1,4-bis(dimethylvinylsilyl)benzene, 1,2-bis(diethylvinylsilyl)benzene, 1,3-bis(diethylvinylsilyl)benzene, and 1,4-bis(diethylvinylsilyl)benzene; wherein 1,2-bis(dimethylvinylsilyl)benzene and 1,4-bis(dimethylvinylsilyl)benzene are preferable, and 1,4-bis(dimethylvinylsilyl)benzene is more preferable.

A compound represented by the aforementioned general formula (28) is a compound having two to three vinyl groups in a single molecule. In the aforementioned general formula (28), p represents a number from 1 to 2.

Examples of compounds represented by the aforementioned general formula (28) wherein p is 1 include 1,2-divinylbenzene, 1,3-divinylbenzene, and 1,4-divinylbenzene.

Examples of compounds represented by the aforementioned general formula (28) wherein p is 2 include 1,2,4-trivinylbenzene and 1,3,5-trivinylbenzene.

A compound represented by the aforementioned general formula (29) is a compound having two to four vinyl groups in a single molecule. In the aforementioned general formula (29), q represents a number from 1 to 3.

Examples of compounds represented by the aforementioned general formula (29) wherein q is 1 include 1,2-divinylcyclohexane, 1,3-divinylcyclohexane, and 1,4-divinylcyclohexane.

Examples of compounds represented by the aforementioned general formula (29) wherein q is 2 include 1,2,4-trivinylcyclohexane and 1,3,5-trivinylcyclohexane.

An example of a compound represented by the aforementioned general formula (29) wherein q is 3 includes 1,2,4,5-tetravinylcyclohexane.

A compound represented by the aforementioned general formula (30) is a compound having two to three vinyl groups in a single molecule. In the aforementioned general formula (30), $R^{27}$ represents a $C_{1-4}$ alkyl group, a $C_{6-10}$ aryl group, a glycidyl group, or an allyl group. It is preferable that $R^{27}$ is a methyl group, ethyl group, glycidyl group, or allyl group.

Preferable compounds among compounds represented by the aforementioned general formula (30) include 1,3-diallyl-5-methylisocyanurate, 1,3-diallyl-5-ethylisocyanurate, 1,3-diallyl-5-glycidylisocyanurate, and 1,3,5-triallylisocyanurate.

In the aforementioned general formula (2), c represents a number from 2 to 4. If $R^3$ is a residue in which vinyl groups have been removed from a compound having two vinyl groups in a single molecule and having a molecular weight of 1000 or less, then c represents 2; if $R^3$ is a residue in which vinyl groups have been removed from a compound having three vinyl groups in a single molecule and having a molecular weight of 1000 or less, then c represents 3; and if $R^3$ is a residue in which vinyl groups have been removed from a compound having four vinyl groups in a single molecule and having a molecular weight of 1000 or less, then c represents 4.

If the substituent having a glycidyl group in the siloxane compound represented by the aforementioned general formula (2) is a group represented by one of the aforementioned formulae (16) to (23), then a compound represented by one of the aforementioned formulae (16a) to (23a) may be subjected to a hydrosilylation reaction with a compound represented by the following general formula (2b), which is obtained by subjecting a compound having two to four vinyl groups in a single molecule and having a molecular weight of 1000 or less to a hydrosilylation reaction with an SiH group in a cyclic siloxane compound represented by the following general formula (2a). The reaction conditions for the hydrosilylation reaction may be the same as those for siloxane compounds represented by the aforementioned general formula (1),

[Chemical Formula 19]

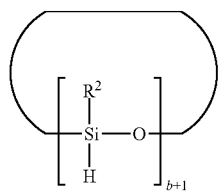

(2a)

wherein $R^2$ and b are as defined in the aforementioned general formula (2),

[Chemical Formula 20]

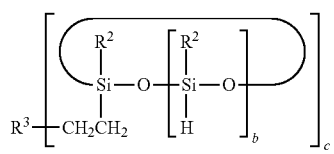

(2b)

wherein $R^2$, $R^3$, b, and c are as defined in the aforementioned general formula (2).

Next, the siloxane compound represented by the aforementioned general formula (3) will be explained. In general formula (3), $R^4$ to $R^8$ each represent a $C_{1-4}$ alkyl group or a $C_{6-10}$ aryl group which may be the same as or different from one another. Examples of $C_{1-4}$ alkyl groups and $C_{6-10}$ aryl groups include groups given as examples for $R^1$ in the aforementioned general formula (1). It is preferable that $R^4$ to $R^8$ are each a methyl group, ethyl group, propyl group, or phenyl group, more preferably a methyl group, ethyl group, or phenyl group, and even more preferably a methyl group, because of good heat resistance. The letter "d" represents a number from 0 to 100, and "e" represents a number from 0 to 100. From the viewpoint of miscibility with component (A), d+e is preferably a number from 0 to 100, more preferably a number from 0 to 30, and even more preferably a number from 0 to 10. G represents a substituent having a glycidyl group. $X^1$ represents a methyl group or a substituent having a glycidyl group, and if d is 0 or 1, $X^1$ represents a substituent having a glycidyl group. Examples of substituents having a glycidyl group are the same as those in the aforementioned general formula (1).

If the substituent having a glycidyl group in the siloxane compound represented by the aforementioned general formula (3) is a group represented by one of the aforementioned formulae (16) to (23), then a compound represented by one of the aforementioned formulae (16a) to (23a) may be subjected to a hydrosilylation reaction with an SiH group in an acyclic siloxane compound represented by the following general formula (3a). The reaction conditions for the hydrosilylation reaction may be the same as those for siloxane compounds represented by the aforementioned general formula (1),

[Chemical Formula 21]

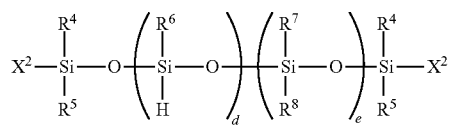

(3a)

wherein $R^4$ to $R^8$, d, and e are as defined in the aforementioned general formula (3). $X^2$ represents a methyl group or a hydrogen atom, provided that if d is 0 or 1, $X^2$ represents a hydrogen atom.

Finally, the novel siloxane compound of the present invention represented by the aforementioned general formula (4) will be explained. In the general formula (4), $R^9$ represents a $C_{1-4}$ alkyl group or a $C_{6-10}$ aryl group. Examples of $C_{1-4}$ alkyl groups and $C_{6-10}$ aryl groups include groups given as examples for $R^1$ in the aforementioned general formula (1). It is preferable that $R^9$ is a methyl group, ethyl group, or phenyl group, more preferably a methyl group or phenyl group, and even more preferably a methyl group, from the viewpoint of heat resistance.

$R^{11}$ represents a hydrogen atom or a methyl group.

$R^{10}$ and $R^{12}$ may be bonded. If $R^{10}$ and $R^{12}$ are not bonded, $R^{10}$ represents a $C_{2-10}$ divalent linking group, and $R^{12}$ represents a hydrogen atom or a methyl group. If $R^{10}$ and $R^{12}$ are bonded, $R^{10}$ represents a trivalent or tetravalent linking group, and $R^{12}$ represents a methylene group or a methine group.

Examples of $C_{2-10}$ divalent linking groups include the ethylene group, trimethylene group, tetramethylene group, pentamethylene group, hexamethylene group, heptamethylene group, octamethylene group, nonamethylene group, decamethylene group, 1-methylethylene group, 2-methylethylene group, 2-ethylethylene group, 4-methyltetramethylene group, 2-oxymethylene ethyl group, 3-oxymethylene propyl group, 3-oxymethylene butyl group, 3-oxymethylene-2-methylpropyl group, 3-oxymethylene-3-oxopropyl group, 3-oxymethylene-3-oxo-2-methylpropyl group, 4-oxymethylene-4-oxobutyl group, 3-(oxytetramethylene)propyl group, 3-(oxy-1-oxotetramethylene)propyl group, 2-(2-phenylene)ethyl group, 2-(4-phenylene)ethyl group, 2-(2-phenylene)propyl group, 2-(4-phenylene)propyl group, 3-(2-phenylene)propyl group, 3-(4-phenylene)propyl group, 2-(2-phenylene)ethyl group, 2-(4-phenylene)ethyl group, 3-(oxy-4-phenylene)propyl group, and 3-(oxy-4-phenylene)-2-methylpropyl group.

If $R^{10}$ and $R^{12}$ are not bonded, then the partial structure represented by the following general formula (31) in the aforementioned general formula (4) is preferably a structure represented by one of the following formulae (32) to (45).

[Chemical Formula 22]

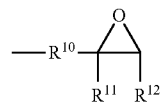

(31)

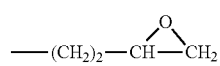

(32)

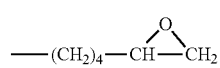

(33)

-continued

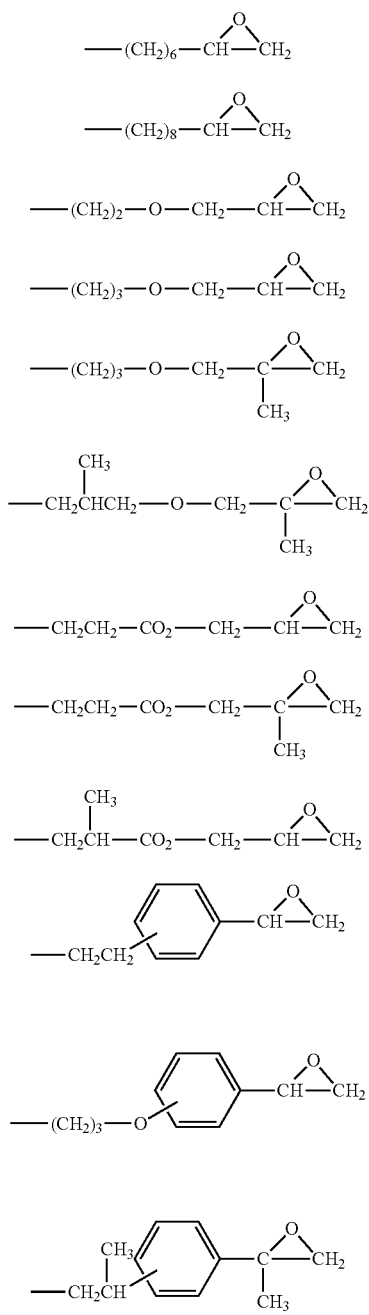

(34) (35) (36) (37) (38) (39) (40) (41) (42) (43) (44) (45)

If $R^{10}$ and $R^{12}$ are bonded—i.e., if $R^{10}$ and $R^{12}$ are bonded to form a cyclic structure—then $R^{12}$ represents a methylene group or a methine group and $R^{10}$ represents a trivalent or tetravalent linking group. It is preferable that the trivalent or tetravalent linking group is a $C_{2-10}$ group. It is preferable that the cyclic structure formed in cases where $R^{10}$ and $R^{12}$ are bonded is a cyclohexyl structure or a bicyclo[2,2,1]heptyl structure from the viewpoint of easy industrial availability and heat resistance.

If $R^{10}$ and $R^{12}$ are bonded, then the partial structure represented by the aforementioned general formula (31) in the aforementioned general formula (4) is preferably a structure represented by one of the following formulae (46) to (50).

[Chemical Formula 23]

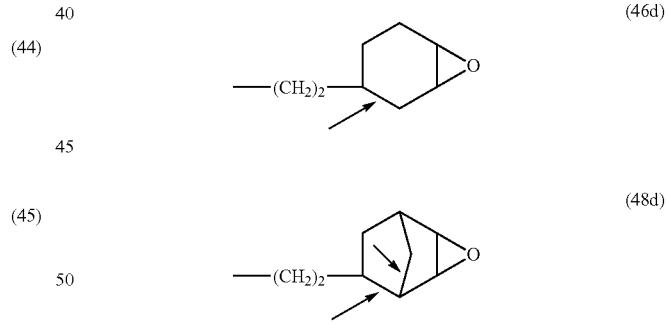

(46) (47) (48) (49) (50)

It should be noted that, in the aforementioned formulae (46) to (50), for example, formulae (46) and (48) can be regarded as structures in which $R^{10}$ and $R^{12}$ have bonded at the sections indicated by the arrows in formulae (46d) and (48d).

[Chemical Formula 24]

(46d)

(48d)

As for $R^{10}$ to $R^{12}$, from the viewpoint of easy industrial availability of materials and good material reactivity, $R^{10}$ to $R^{12}$ that give the aforementioned formula (37) or (46) as the partial structure represented by the aforementioned general formula (31) are preferable, and $R^{10}$ to $R^{12}$ that give the aforementioned formula (37) are more preferable.

$R^{13}$ represents a (meth)acrylic group. It is preferable that $R^{13}$ is an acrylic group because of excellent material reactivity.

$R^{14}$ represents a hydrogen atom, a (meth)acrylic group, or a residue in which one hydroxyl group has been removed from a dibasic acid. Examples of dibasic acids include: aliphatic saturated dibasic acids, such as oxalic acid, malonic acid, succinic acid, glutaric acid, and adipic acid; aliphatic unsaturated dibasic acids, such as fumaric acid, maleic acid, and itaconic acid; aromatic dibasic acids, such as phthalic acid, isophthalic acid, terephthalic acid, and naphthalene dicarboxylic acid; and alicyclic dibasic acids, such as 1,2-cyclohexyl dicarboxylic acid, 1,3-cyclohexyl dicarboxylic acid, 1,4-cyclohexyl dicarboxylic acid, 1,2,3,6-tetrahydrophthalic acid, and 3,4,5,6-tetrahydrophthalic acid. Preferable dibasic acids for cases where $R^{14}$ is a residue in which one hydroxyl group has been removed from a dibasic acid include succinic acid, maleic acid, phthalic acid, 1,2-cyclohexyl dicarboxylic acid, 1,2,3,6-tetrahydrophthalic acid, 3,4,5,6-tetrahydrophthalic acid, 3- or 4-methyl-1,2,3,6-tetrahydrophthalic acid, 3- or 4-methyl-1,2-cyclohexyl dicarboxylic acid, 3,6-endomethylene-1,2,3,6-tetrahydrophthalic acid, and 3- or 4-3,6-endomethylene-1,2,3,6-tetrahydrophthalic acid, because of excellent material reactivity; and phthalic acid, 1,2-cyclohexyl dicarboxylic acid, 1,2,3,6-tetrahydrophthalic acid, and 3,4,5,6-tetrahydrophthalic acid are more preferable because cured products having high hardness can be obtained.

Employing a (meth)acrylic group for $R^{14}$ increases the crosslinking degree of cured products including an epoxy (meth)acrylate compound represented by the aforementioned general formula (4). Employing, for $R^{14}$, a residue in which one hydroxyl group has been removed from a dibasic acid improves the developability for when a photocurable resin composition including an epoxy (meth)acrylate compound represented by the aforementioned general formula (4) is used as a resist material.

The plurality of $R^{14}$s in the aforementioned general formula (4) may be the same as or different from one another. Note that the plurality of $R^9$s to $R^{13}$s in the aforementioned general formula (1) may also be the same as or different from one another.

It is preferable that $R^{14}$ is a hydrogen atom, because the adhesiveness of cured products is improved. In cases where the $R^{14}$s are a combination of two or more types of groups, it is preferable that one is a hydrogen atom, and it is even more preferable that the proportion of hydrogen atoms is from 30 to 90%, even more preferably from 40 to 80%, in mole percentage.

The letter "f" represents a number from 1 to 6, and "g" represents a number from 0 to 5 that makes "f+g" take a number from 3 to 6. Except for when g is 0, f and g are average numbers in a single molecule. Because of easy industrial availability, f+g is preferably a number from 3 to 5, more preferably a number from 3 to 4, and even more preferably 4. From the viewpoint of radical polymerizability, it is preferable that f is greater in number; but from the viewpoint of adhesiveness to base materials, the ratio of f:g is preferably from 15:85 to 85:15, more preferably from 17:83 to 60:40, and even more preferably from 20:80 to 50:50. However, in cases where $R^{14}$ is a residue in which one hydroxyl group has been removed from a dibasic acid, it is preferable that g is 0, because storage stability is improved.

Among epoxy acrylate compounds represented by the aforementioned general formula (4), a compound in which $R^{14}$ is a hydrogen atom—i.e., a compound represented by the following general formula (4a)—can be obtained by reacting acrylic acid or methacrylic acid with an epoxy compound represented by the following general formula (4d), which is obtained by reacting a cyclic siloxane compound represented by the following general formula (4b) and an epoxy compound represented by the following general formula (4c),

[Chemical Formula 25]

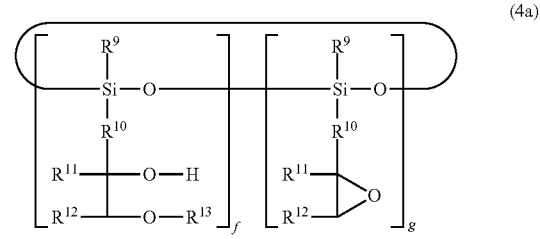

(4a)

wherein $R^9$, $R^{10}$, $R^{11}$, $R^{12}$, $R^{13}$, f, and g are as defined in the aforementioned general formula (4),

[Chemical Formula 26]

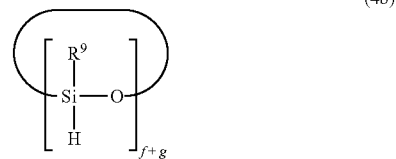

(4b)

wherein $R^9$, f, and g are as defined in the aforementioned general formula (4),

[Chemical Formula 27]

(4c)

wherein $R^{28}$ represents a group that gives $R^{10}$ by reacting with an SiH group, and $R^{11}$ and $R^{12}$ are as defined in the aforementioned general formula (4),

[Chemical Formula 28]

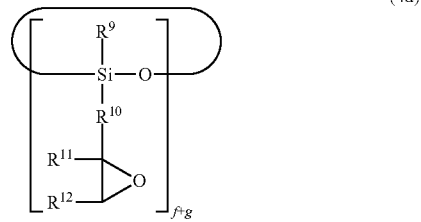

(4d)

wherein $R^9$, $R^{10}$, $R^{11}$, $R^{12}$, $R^{13}$, f, and g are as defined in the aforementioned general formula (4).

In the aforementioned general formula (4b), $R^9$, f, and g are as defined in the aforementioned general formula (4). Concrete examples of preferred compounds among cyclic siloxane compounds represented by the aforementioned general formula (4b) include 2,4,6-trimethylcyclotrisiloxane, 2,4,6-triethylcyclotrisiloxane, 2,4,6-triphenylcyclotrisiloxane, 2,4-dimethyl-6-phenylcyclotrisiloxane, 2,4,6,8-tetramethylcyclotrisiloxane, 2,4,6,8-tetraethylcyclotrisiloxane, 2,4,6,8-tetraphenylcyclotrisiloxane, 2,4,6-trimethyl-8- phenylcyclotrisiloxane, and 2,4-dimethyl-6,8-diphenyltetravinylcyclotrisiloxane.

In the aforementioned general formula (4c), $R^{28}$ represents a group that gives $R^{10}$ by reacting with an SiH group, and $R^{11}$ and $R^{12}$ are as defined in the aforementioned general formula (4). In cases where a structure represented by one of the aforementioned formulae (32) to (50) is employed as the partial structure represented by the aforementioned general formula (31) in the aforementioned general formula (4), an epoxy compound represented by one of the following formulae (32a) to (50a) may be subjected to a hydrosilylation reaction with an SiH group in the cyclic siloxane compound represented by the aforementioned general formula (4b). The reaction conditions for the hydrosilylation reaction may be the same as those for siloxane compounds represented by the aforementioned general formula (1).

[Chemical Formula 29]

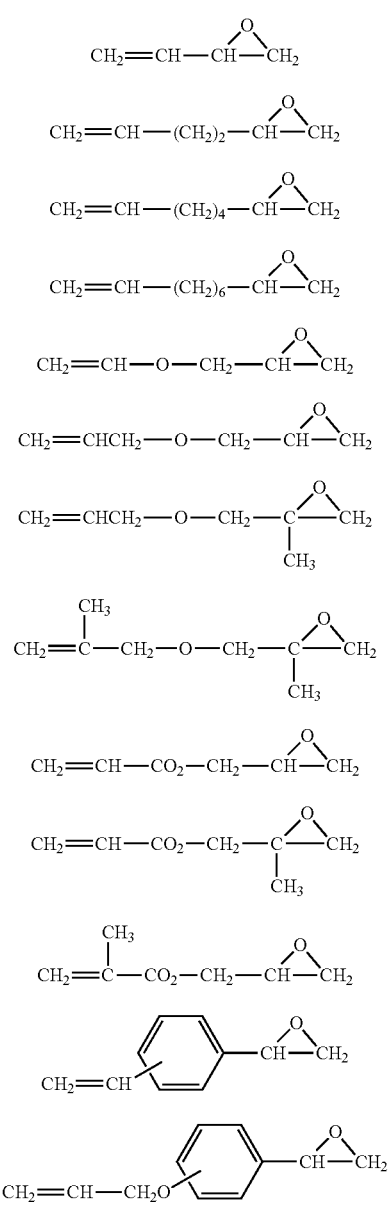
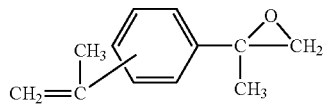
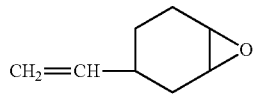
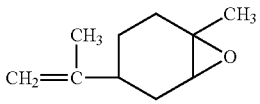
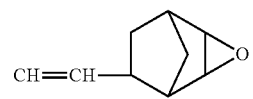
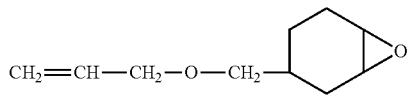
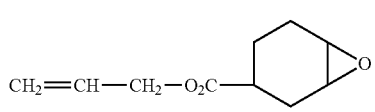

The reaction between an epoxy compound represented by the aforementioned general formula (4d) and (meth)acrylic acid may be performed without a catalyst, but it is preferable to use a reaction catalyst because the reaction proceeds smoothly and a compound represented by the aforementioned general formula (4) can be obtained with high yield. Examples of reaction catalysts include: organophosphorus catalysts, such as triphenylphosphine, tributylphosphine, tri(4-methylphenyl)phosphine, and tri(nonylphenyl)phosphine; imidazole-based catalysts, such as imidazole, 2-methylimidazole, 2,4-dimethylimidazole, 2-ethyl-4-methylimidazole, and 2-phenylimidazole; and tertiary amine-based catalysts, such as triethylamine, trimethylenediamine, benzyldimethylamine, and 1,8-diazabicyclo[5,4,0]undecene-7. However, it is preferable to use an organophosphorus catalyst. The amount of reaction catalyst added is preferably 3 mass % or less of the total amount of the various materials, more preferably 0.0001 to 1 mass %, and even more preferably 0.001 to 0.1 mass %. The reaction temperature is generally from 50 to 150° C., and preferably from 70 to 120° C.

In the reaction between an epoxy compound represented by the aforementioned general formula (4d) and acrylic acid or methacrylic acid, it is preferable to use a polymerization inhibitor with the aim of preventing the polymerization of the acrylic or methacrylic groups. Examples of polymerization inhibitors include: aromatic amines such as phenothiazine and p-phenylenediamine; N-oxylamines such as 2,2,6,6-tetramethyl-1-piperidinyloxy and 4-hydroxy-2,2,6,6-tetramethyl-1-piperidinyloxy; phenol derivatives such as hydroquinone and p-methoxyphenol; nitroso compounds; aromatic nitroso compounds; and copper-based compounds such as copper dibutyldithiocarbamate, copper dimethyldithiocarbamate, and copper acetate. Two or more types of these polymerization inhibitors may be used in combination. The proportion of usage of the polymerization inhibitor is generally from 0.01 to 1 part by mass, and preferably from 0.1 to 0.3 parts by mass, with respect to 100 parts by mass of an epoxy compound represented by the aforementioned general formula (4d).

Among epoxy acrylate compounds represented by the aforementioned general formula (4), a compound in which $R^{14}$ is an acrylic group or a methacrylic group can be obtained by subjecting the hydroxyl group in a compound represented by the aforementioned general formula (4a) to dehydration condensation with acrylic acid or methacrylic acid, or to transesterification with a lower alcohol ester of acrylic acid or methacrylic acid; transesterification with a lower alcohol ester of acrylic acid or methacrylic acid is preferred because reaction is possible under mild conditions. Preferred concrete examples of lower alcohol esters of acrylic acid or methacrylic acid include methyl acrylate, ethyl acrylate, propyl acrylate, isopropyl acrylate, methyl methacrylate, ethyl methacrylate, propyl methacrylate, and isopropyl methacrylate.

It is preferable to use a reaction catalyst in the transesterification reaction. Examples of reaction catalysts include reaction catalysts given as examples for the reaction between an epoxy compound represented by the aforementioned general formula (4d) and acrylic acid or methacrylic acid. The amount of reaction catalyst added is preferably 3 mass % or less of the total amount of the various materials, more preferably 0.0001 to 1 mass %, and even more preferably 0.001 to 0.1 mass %. The reaction temperature is generally from 50 to 150° C., and preferably from 70 to 120° C.

Among epoxy acrylate compounds represented by the aforementioned general formula (4), a compound wherein $R^{14}$ is a residue in which one hydroxyl group has been removed from a dibasic acid can be obtained by reacting a dibasic acid or an acid anhydride thereof with the hydroxyl group in a compound represented by the aforementioned general formula (4a); it is preferable to react an acid anhydride of a dibasic acid because reaction is possible under mild conditions. Preferred concrete examples of acid anhydrides of dibasic acids include succinic anhydride, maleic anhydride, phthalic anhydride, and 1,2-cyclohexyl dicarboxylic anhydride.

It is preferable to use a reaction catalyst at the time of reacting an acid anhydride of a dibasic acid. Examples of reaction catalysts include reaction catalysts given as examples for the reaction between an epoxy compound represented by the aforementioned general formula (4d) and (meth)acrylic acid. Also, examples of metal alcoholates of transesterification catalysts include titanium alcoholates, zirconium alcoholates, aluminum alcoholates, and antimony alcoholates. Titanium alcoholates are preferred because of good reactivity. Examples of titanium alcoholates include titanium tetramethoxide, titanium tetraethoxide, titanium tetra-n-propoxide, and titanium tetra-n-butoxide, wherein titanium tetra-n-butoxide is more preferred. The amount of reaction catalyst added is preferably 3 mass % or less of the total amount of the various materials, more preferably 0.0001 to 1 mass %, and even more preferably 0.001 to 0.1 mass %. The reaction temperature is generally from 50 to 150° C., and preferably from 70 to 120° C.

It is preferable that the component (C) of the photocurable resin composition of the present invention is a siloxane compound represented by one of the aforementioned general formula (1), (2), or (4), more preferably a siloxane compound represented by either the aforementioned general formula (1) or (4), and even more preferably a siloxane compound represented by the aforementioned general formula (4).

In the photocurable resin composition of the present invention, the content of component (C) is preferably 0.1 to 30 parts by mass, more preferably 0.5 to 20 parts by mass, and even more preferably 2 to 15 parts by mass, with respect to 100 parts by mass of the component (A).

Next, component (D) of the present invention—i.e., the photoradical generating agent-will be explained. In the present invention, a photoradical generating agent refers to a compound that generates radicals by being irradiated with, for example, gamma rays, X-rays, ultraviolet rays, visible rays, an electron beam, or the like.

Examples of photoradical generating agents include acetophenone-based photoradical generating agents, benzil-based photoradical generating agents, benzophenone-based photoradical generating agents, thioxanthone-based photoradical generating agents, acylphosphine oxide-based photoradical generating agents, and oxime-based photoradical generating agents.

Examples of the aforementioned acetophenone-based photoradical generating agents include diethoxyacetophenone, 2-hydroxy-2-methyl-1-phenylpropan-1-one, 4'-isopropyl-2-hydroxy-2-methylpropiophenone, 2-hydroxymethyl-2-methylpropiophenone, 2,2-dimethoxy-1,2-diphenylethan-1-one, p-dimethylaminoacetophenone, p-tertiary-butyldichloroacetophenone, p-tertiary-butyltrichloroacetophenone, p-azidobenzalacetophenone, 1-hydroxycyclohexyl phenyl ketone, 2-methyl-1-[4-(methylthio)phenyl]-2-morpholinopropanone-1,2-benzyl-2-dimethylamino-1-(4-morpholinophenyl)-butanone-1, benzoin, benzoin methyl ether, benzoin ethyl ether, benzoin isopropyl ether, benzoin n-butyl ether, benzoin isobutyl ether, and oligomers of 2-hydroxy-2-methyl-1-[4-vinyl-(1-methyl vinyl) phenyl]propanone.

Examples of the aforementioned benzil-based photoradical generating agents include diphenyl diketone (also called benzil) and bis(4-methoxyphenyl) diketone (also called anisil).

Examples of the aforementioned benzophenone-based photoradical generating agents include benzophenone, methyl o-benzoylbenzoate, Michler's ketone, 4,4'-bisdiethylaminobenzophenone, 4,4'-dichlorobenzophenone, and 4-benzoyl-4'-methyldiphenyl sulfide.

Examples of the aforementioned thioxanthone-based photoradical generating agents include thioxanthone, 2-methylthioxanthone, 2-ethylthioxanthone, 2-chlorothioxanthone, 2-isopropylthioxanthone, and 2,4-diethylthioxanthone.

Examples of the aforementioned acylphosphine oxide-based photoradical generating agents include: monoacylphosphine oxide-based photoradical generating agents, such as 2-methylbenzoyldiphenylphosphine oxide, 2,4,6-trimethylbenzoyldiphenylphosphine oxide, and methyl 2,4,6-trimethylbenzoylphenylphosphinate; and bisacylphosphine oxide-based photoradical generating agents, such as bis(2,6-dimethoxybenzoyl)phenylphosphine oxide, bis(2,4,6-trimethylbenzoyl)phenylphosphine oxide, and bis(2,6-dimethoxybenzoyl)-2,4,4-trimethylpentylphosphine oxide.

Examples of the aforementioned oxime-based photoradical generating agents include 1-{(4-phenylthio)phenyl}-1,2-butanedione-2-(O-benzoyloxime), 1-{(4-phenylthio)phenyl}-1,2-octanedione-2-(O-benzoyloxime), 1-{(4-phenylthio)phenyl}-1-octanone-1-(O-acetyloxime), 1-{4-(2-hydroxyethoxyphenylthio)phenyl}-1,2-propanedione-2-(O-acetyloxime), 1-[9-ethyl-6-(2-methylbenzoyl)-9H-carbazol-3-yl]ethanone-1-(O-acetyloxime), and (9-ethyl-6-nitro-9H-carbazol-3-yl) {4-(2-methoxy)-1-methylethoxy}-2-methylpheny 1}methanone(O-acetyloxime).

It is preferable that the aforementioned photoradical generating agent is an oxime-based photoradical generating agent because of the good reactivity of the photocurable resin composition of the present invention; 1-{(4-phenylthio)phenyl}-1,2-octanedione-2-(O-benzoyloxime) and 1-{4-(2-hydroxyethoxyphenylthio)phenyl}-1,2-propanedione-2-(O-acetyloxime) are more preferable, and 1-{4-(2-hydroxyethoxyphenylthio)phenyl}-1,2-propanedione-2-(O-acetyloxime) is even more preferable. One type of photoradical generating agent may be used, or two or more types thereof may be used in combination.

In the photocurable resin composition of the present invention, curing may become insufficient if the content of the component (D) is too small, whereas the physical properties of the cured products may be negatively affected if the content is too large. Thus, the content of the component (D) is preferably from 0.3 to 20 parts by mass, and more preferably from 1 to 5 parts by mass, with respect to 100 parts by mass of the photocurable resin composition (excluding organic solvents) of the present invention.

It is preferable for the photocurable resin composition of the present invention to further include (E) an acrylate phosphate compound because adhesiveness is further improved. In the present invention, an acrylate phosphate compound refers to a phosphate compound having, in its molecule, an acrylic group or a methacrylic group. It is preferable that the acrylate phosphate compound is a compound represented by the following general formula (51), because of the significant effect of improving adhesiveness,

[Chemical Formula 30]

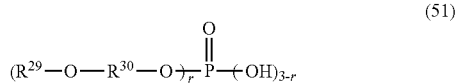

(51)

wherein $R^{29}$ represents an acrylic group or a methacrylic group, $R^{30}$ represents a $C_{2-4}$ alkylene group, and r represents a number from 1 to 3.

$R^{29}$ represents an acrylic group or a methacrylic group, and is preferably an acrylic group because of excellent storage stability. $R^{30}$ represents a $C_{2-4}$ alkylene group. Examples of $C_{2-4}$ alkylene groups include the ethylene group, trimethylene group, tetramethylene group, 1-methylethylene group, 2-methylethylene group, 1-ethylethylene group, and 2-ethylethylene group. It is preferable that $R^{30}$ is an ethylene group, 1-methylethylene group, or 2-methylethylene group, more preferably an ethylene group, because of the significant effect of improving adhesiveness. The letter "r" represents a number from 1 to 3. It is preferable that r is 1 or 2 because of the significant effect of improving adhesiveness; in this case, the aforementioned compound may be a mixture of a compound in which r is 1 and a compound in which r is 2.

In the photocurable resin composition of the present invention, adhesiveness is not improved if the content of the component (E) is too small, whereas the storage stability of the photocurable resin composition of the present invention and/or the water resistance of the cured products will be negatively affected if the content is too large. Thus, the content of the component (E) is preferably from 0.2 to 10 parts by mass, and more preferably from 1 to 8 parts by mass, with respect to 100 parts by mass of the component (A).

The photocurable resin composition of the present invention may also include, if necessary, (F) an organic solvent in addition to the aforementioned components (A) to (E). The organic solvent is a component that is blended so as to dissolve the photocurable resin composition of the present invention and to give the composition a viscosity suitable for various coating methods, such as spin coating, dip coating, knife coating, roll coating, spray coating, and slit coating.

Examples of organic solvents include: aromatic hydrocarbons, such as toluene and xylene; alcohols, such as methanol and isopropyl alcohol; esters, such as ethyl acetate and butyl acetate; ethers, such as 1,4-dioxane and tetrahydrofuran; ketones, such as methyl ethyl ketone and methyl isobutyl ketone; glycol derivatives, such as cellosolve, butylcellosolve, and cellosolve acetate; alicyclic hydrocarbons, such as cyclohexanone and cyclohexanol; and petroleum-based solvents, such as petroleum ether and petroleum naphtha.

The component (F) is not particularly limited so long as it can dissolve components (A) to (E) uniformly; however, glycol derivatives are preferable because the deterioration of scratch resistance is small. The content of the component (F) is not particularly limited, but is preferably from 30 to 300 parts by mass with respect to 100 parts by mass of the total amount of the components (A) to (E).

Further, if necessary, it is possible to add various types of additives, examples including: fillers, such as talc, barium sulfate, silica, and clay; thixotropes, such as Aerosil; coloring agents, such as phthalocyanine blue, phthalocyanine green, and titanium oxide; silicone-based and fluorine-based leveling agents and antifoaming agents; and polymerization inhibitors, such as hydroquinone and hydroquinone monomethyl ether.

The photocurable resin composition of the present invention is first applied onto a target material, and then cured by active energy rays, such as visible rays, ultraviolet rays, or X-rays. Usable coating methods include known methods such as spin coating, dip coating, knife coating, roll coating, spray coating, and slit coating. The thickness of the coating film of the photocurable resin composition of the present invention may differ depending on the purpose of usage; in cases where the composition is used as a hard-coat material for an image display surface of an image display device, it is preferable that the film thickness, after curing, is from 0.1 to 30 µm. In cases where the photocurable resin composition of the present invention includes an organic solvent (F), it is preferable that, after the photocurable resin composition of the present invention is applied, the composition is first pre-baked and then cured. Pre-baking may be for 30 seconds to 30 minutes in a range from 50 to 150° C. by using a heating device, such as a hot plate or an oven.

For curing the coating film of the photocurable resin composition of the present invention, examples of sources of active energy rays, such as ultraviolet rays, include ultra-high-pressure mercury-vapor lamps, Deep UV lamps, high-pressure mercury-vapor lamps, low-pressure mercury-vapor lamps, metal halide lamps, and excimer lasers. The light source can be chosen as appropriate depending on the photosensitive wavelengths of the photoradical generating agent and sensitizers. The radiation energy of the active energy rays can be chosen as appropriate depending on the thickness of the layer of the photocurable resin composition and/or the type and amount of usage of the photoradical generating agent.

Coating films prepared from the photocurable resin composition of the present invention can be photolithographed and can be used as alkali-developable negative-type photoresists. In cases of using the present coating film as a negative-type photoresist, a patterned cured film can be formed by: covering the coating film formed from the photocurable resin composition of the present invention with a photomask at the time of irradiating the coating film with active energy rays, and then selectively irradiating the coating film with the active energy rays; and then removing the sections shielded from the light (uncured sections) by dissolving and dispersing those sections with an alkali developing fluid (this may be referred to as "developing"). The alkali developing fluid is a fluid made by blending, for example, a water-soluble organic solvent, a surfactant, etc., as necessary into an aqueous solution of an alkaline compound. Examples of alkaline compounds for the alkali developing fluid include: inorganic alkali compounds, such as sodium hydroxide, potassium hydroxide, sodium carbonate, and potassium carbonate; and amines and ammonium compounds, such as trimethylamine, methyldiethylamine, dimethylethylamine, triethylamine, dimethylethanolamine, methyldiethanolamine, triethanolamine, pyrrole, piperidine, cyclic tertiary amines—such as N-methylpiperidine, N-methylpyrrolidine, 1,8-diazabicyclo [5.4.0]-7-undecene, and 1,5-diazabicyclo [4.3.0]-5-nonene—tetramethylammonium hydroxide, and tetraethylammonium hydroxide.

After the development, it is preferable to perform postbaking because the hardness of the cured film is further improved. It is preferable to perform post-baking for 5 minutes to 3 hours from 160° C. to 250° C. by using a heating device, such as a hot plate or an oven.

Cured films prepared from the photocurable resin composition of the present invention have excellent transparency, heat resistance, weather resistance, chemical resistance, and scratch resistance, and are thus useful for purposes such as interlayer insulating films, planarizing films, or permanent insulating films for semiconductor devices. Other than the above, the photocurable resin composition of the present invention is useful as hard-coat materials for plastic parts, and is particularly useful as hard-coat materials for, for example, illumination parts, such as illumination covers and decorative materials, and automobile parts, such as headlamp components and instrument panel components, and for automobile coatings.

EXAMPLES

Below, the present invention will be described in further detail by way of production examples, examples, and comparative examples. The present invention, however, is not limited to the following production examples and examples. It should be noted that, unless particularly stated otherwise, "parts" and "%" in the examples are based on mass. Further, the mass-average molecular weight refers to the mass-average molecular weight in terms of polystyrene by performing a GPC (Gel Permeation Chromatography) analysis by employing tetrahydrofuran as the solvent. Further, the epoxy equivalent was measured in compliance with JIS K-7236 (determination method for epoxy resin). The acrylic equivalent (the mass (number of grams) of an acrylic compound including 1 equivalent weight of acryloxy groups) was calculated from the ratio of the area of the peak (5.8 to 6.4 ppm) ascribed to the acryloxy group to the area of the peak (0.09 ppm) ascribed to the methylsilyl group (Si—CH$_3$) in $^1$H-NMR.

Production Examples 1 and 2 describe examples for producing siloxane compounds represented by the aforementioned general formula (1), which are components (C). Production Example 3 describes an example for producing a siloxane compound represented by the aforementioned general formula (2), which is component (C). Production Example 4 describes an example for producing a siloxane compound (a compound represented by the aforementioned general formula (4d)) that is a comparative product of component (C) and that is used as a material for a siloxane compound represented by the aforementioned general formula (4), which is component (C).

Production Examples 5 to 10 describe examples for producing novel siloxane compounds of the present invention represented by the aforementioned general formula (4), which are components (C).

Examples 1 to 17 and Comparative Examples 1 to 13 describe production examples and evaluation examples of photocurable resin compositions according to the present invention and comparative photocurable resin compositions.

Production Example 1

Production of Siloxane Compound C1

To a glass reaction vessel provided with a thermometer and a stirring device were added 240 g (1 mol) of 2,4,6,8-tetramethylcyclotetrasiloxane, 456 g (4 mol) of allyl glycidyl ether, 300 g of toluene as a solvent, and 15 mg of a platinum-divinyltetramethyldisiloxane complex (Karstedt catalyst) as a catalyst, and the ingredients were reacted for 15 hours at 50 to 60° C. while being stirred. The solvent was removed from the reaction fluid by evaporation under reduced pressure at 60° C., thus obtaining a reaction product. From analysis results, it was verified that the obtained reaction product was a siloxane compound having a structure represented by the following formula. This siloxane compound is a compound wherein, in the aforementioned general formula (1), $R^1$ is a methyl group, G is a 3-glycidyloxypropylene group, and a is 4. The analysis results are described below. It should be noted that this siloxane compound is referred to as siloxane compound C1.

[Chemical Formula 31]

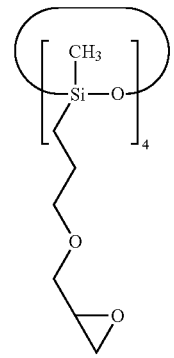

(C1)

Analysis Results:
Epoxy equivalent: 174
$^1$H-NMR: 0.09 ppm (12H, Si—CH$_3$), 0.62 ppm (8H, Si—CH$_2$—C), 1.55 ppm (8H, C—CH$_2$—C), 2.5 to 3.2 ppm (12H, oxirane ring moiety), 3.4 to 3.7 ppm (16H, —CH$_2$—O—CH$_2$—)

Production Example 2

Production of Siloxane Compound C2

The same operation as in Production Example 1 was performed except that reaction was carried out by using 512 g (4 mol) of 2,3-epoxypropylacrylate in place of 456 g (4 mol) of allyl glycidyl ether and adding 0.05 g of p-methoxyphenol as a polymerization inhibitor in Production Example 1, thus obtaining a siloxane compound having a structure represented by the following formula. This siloxane compound is a compound wherein, in the aforementioned general formula (1), $R^1$ is a methyl group, G is a 3-glycidylcarbonyloxypropyl group, and a is 4. It should be noted that this siloxane compound is referred to as siloxane compound C2.

[Chemical Formula 32]

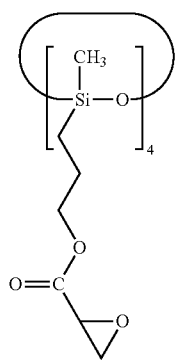

(C2)

Production Example 3

Production of Siloxane Compound C3

To a glass reaction vessel provided with a thermometer and a stirring device were added 240 g (1 mol) of 2,4,6,8-tetramethylcyclotetrasiloxane, 96 g (0.5 mol) of 1,1,3,3-tetramethyl-1,3-vinyldisiloxane, 300 g of toluene as a solvent, and 15 mg of a platinum-divinyltetramethyldisiloxane complex (Karstedt catalyst) as a catalyst, and the ingredients were reacted for 3 hours at 50 to 60° C. while being stirred. Further, 342 g (3 mol) of allyl glycidyl ether was added, and the mixture was reacted for 15 hours at 50 to 60° C. while being stirred. The solvent was removed from the reaction fluid by evaporation under reduced pressure at 60° C., thus obtaining a siloxane compound having a structure represented by the following formula. This siloxane compound is a compound wherein, in the aforementioned general formula (2), $R^2$ is a methyl group, b is 3, c is 3, and $R^3$ is a residue wherein the vinyl groups have been removed from 1,1,3,3-tetramethyl-1,3-vinyldisiloxane. It should be noted that this siloxane compound is referred to as siloxane compound C3.

[Chemical Formula 33]

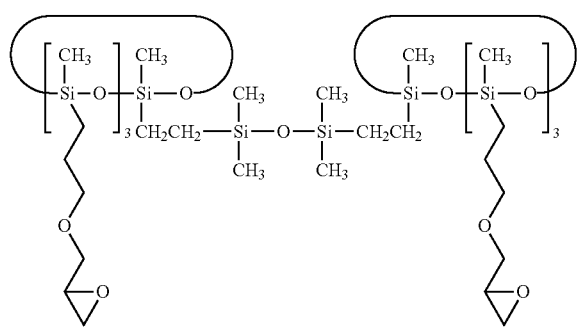

(C3)

Production Example 4

Production of Siloxane Compound C4

The same operation as in Production Example 3 was performed except that reaction was carried out by using 65 g (0.5 mol) of 1,4-divinylbenzene in place of 96 g (0.5 mol) of 1,1,3,3-tetramethyl-1,3-vinyldisiloxane and adding 0.05 g of p-methoxyphenol as a polymerization inhibitor in Production Example 3, thus obtaining a siloxane compound having a structure represented by the following formula. This siloxane compound is a compound wherein, in the aforementioned general formula (2), $R^2$ is methyl, b is 3, c is 3, and $R^3$ is a residue wherein the vinyl groups have been removed from divinylbenzene (i.e., a 1,4-phenylene group). It should be noted that this siloxane compound is referred to as siloxane compound C4.

[Chemical Formula 34]

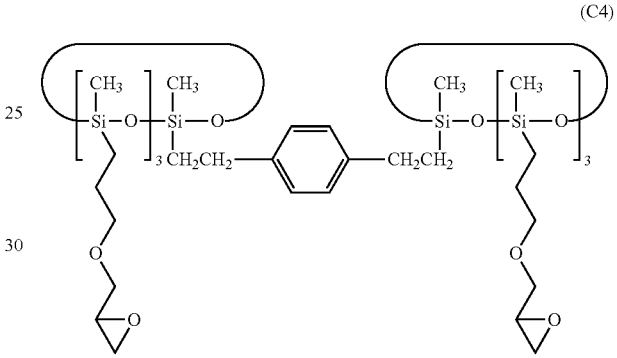

(C4)

Production Example 5

Production of Siloxane Compound C'1

The same operation as in Production Example 1 was performed except that 496 g (4 mol) of 1,2-epoxy-4-vinylcyclohexane was used in place of 456 g (4 mol) of allyl glycidyl ether in Production Example 1, thus obtaining a reaction product. From analysis results, it was verified that the obtained reaction product was a siloxane compound having a structure represented by the following formula. The analysis results are described below. It should be noted that this siloxane compound is referred to as siloxane compound C'1.

[Chemical Formula 35]

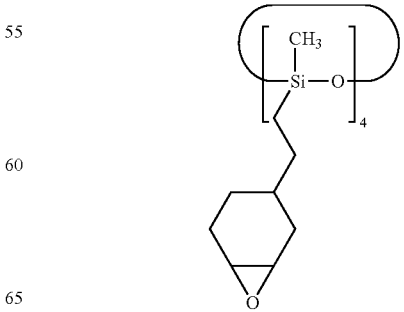

(C'1)

Analysis Results:
Epoxy equivalent: 184
$^1$H-NMR: 0.09 ppm (12H, Si—CH$_3$), 0.56 ppm (8H, Si—CH$_2$—C), 0.9 ppm (12H, Si—CH$_2$—CH$_2$—CH<), 1.2 to 2.0 ppm (24H, other cyclohexane ring moieties), 3.0 to 3.2 ppm (8H, oxirane ring moiety)

Production Example 6

Production of Siloxane Compound C5

To a glass reaction vessel provided with a thermometer and a stirring device were added 174 g (0.25 mol) of the siloxane compound C1 obtained in Production Example 1, 20 g (0.28 mol) of acrylic acid, 200 g of toluene as a solvent, and 1 g of triphenylphosphine as a catalyst, and the ingredients were reacted for 5 hours at 60 to 80° C. while being stirred. Then, the mixture was washed with water by adding 200 g of distilled water, and then the water and the solvent were removed at 60° C. by reducing the pressure, thus obtaining a reaction product. From analysis results, it was verified that the obtained reaction product was a compound wherein, in the aforementioned general formula (4), $R^9$ is methyl, $R^{10}$ is 3-methyleneoxypropylene, $R^{11}$ and $R^{12}$ are hydrogen atoms, $R^{13}$ is acrylic, $R^{14}$ is a hydrogen atom, f is 1.5, and g is 2.5. The analysis results are described below. It should be noted that this reaction product is referred to as siloxane compound C5.
Analysis Results:
Epoxy equivalent: 268
Acrylic equivalent: 699
$^1$H-NMR: 0.09 ppm (12H, Si—CH$_3$), 3.0 to 3.2 ppm (7.56H, oxirane ring moiety), 5.7 to 6.5 ppm (4.44H, acrylic moiety)

Production Example 7

Production of Siloxane Compound C6

To a glass reaction vessel provided with a thermometer and a stirring device were added 174 g (0.25 mol) of the siloxane compound C1 obtained in Production Example 1, 79.3 g (1.1 mol) of acrylic acid, 200 g of toluene as a solvent, and 1 g of triphenylphosphine as a catalyst, and the ingredients were reacted for 5 hours at 60 to 80° C. while being stirred. Then, the mixture was washed with water by adding 300 g of saturated salt water, the water and the solvent were then removed at 60° C. by reducing the pressure, and the resultant was filtered, thus obtaining a reaction product. From analysis results, it was verified that the obtained reaction product was a compound wherein, in the aforementioned general formula (4), $R^9$ is methyl, $R^{10}$ is 3-methyleneoxypropylene, $R^{11}$ and $R^{12}$ are hydrogen atoms, $R^{13}$ is acrylic, $R^{14}$ is a hydrogen atom, f is 4, and g and 0. The analysis results are described below. It should be noted that this reaction product is referred to as siloxane compound C6.
Analysis Results:
Epoxy equivalent: Not detected
Acrylic equivalent: 244
$^1$H-NMR: 0.09 ppm (12H, Si—CH$_3$), 5.7 to 6.5 ppm (11.6H, acrylic moiety)

Production Example 8

Production of Siloxane Compound C7

To a glass reaction vessel provided with a thermometer and a stirring device were added 97.4 g (0.1 mol) of the siloxane compound C6 obtained in Production Example 7, 15.4 g (0.1 mol) of 1,2-cyclohexyldicarboxylic acid, and 91.6 g of propylene glycol monomethyl ether acetate (referred to hereinafter as "PGMEA") as a solvent, and the ingredients were reacted for 8 hours at 95 to 105° C. while being stirred. From analysis results, it was verified that the reaction product included in the obtained reaction fluid was a compound wherein, in the aforementioned general formula (4), $R^9$ is methyl, $R^{10}$ is 3-methyleneoxypropylene, $R^{11}$ and $R^{12}$ are hydrogen atoms, $R^{13}$ is acrylic, $R^{14}$ is a hydrogen atom or a residue wherein one hydroxyl group has been removed from 1,2-cyclohexyldicarboxylic acid (the ratio between hydrogen atoms residues wherein one hydroxyl group has been removed from 1,2-cyclohexyldicarboxylic acid is 3:1), f is 4, and g is 0. The analysis results are described below. It should be noted that this solid is referred to as siloxane compound C7. The aforementioned reaction fluid was a 50% PGMEA solution of the siloxane compound C7.
Analysis Results:
Epoxy equivalent: Not detected
Acrylic equivalent: 281.6
Acid value: 49.7 mgKOH/g
$^1$H-NMR: 0.09 ppm (12H, Si—CH$_3$), 5.7 to 6.5 ppm (11.6H, acrylic moiety)

Production Example 9

Production of Siloxane Compound C8

To a glass reaction vessel provided with a distillation device, a thermometer, and a stirring device were added 76.9 g (0.1 mol) of the siloxane compound C5 obtained in Production Example 6, 86 g of methylacrylate, 70 g of toluene and 130 g of n-hexane as solvents, and 4.6 g of tetrabutyl-n-titanate as a catalyst, and the ingredients were heated and increased in temperature while being stirred. Azeotropic refluxing of methanol/n-hexane (azeotropic temperature: 50 to 52° C.) started from when the reaction fluid temperature reached around 72° C. Reaction was conducted for 8 hours while extracting the azeotropic fluid of methanol/n-hexane (final reaction temperature: 92° C.). The fluid was then cooled, 140 g of water was added, the solution was stirred for 30 minutes at 60° C., and the catalyst was decomposed. The reaction fluid was cooled and filtered to remove the insoluble catalyst and was then left still, and the separated aqueous layer was removed. The water and the solvent were removed by reducing the pressure of the remaining organic layer at 60° C., thus obtaining a reaction product. From analysis results, it was verified that the obtained reaction product was a compound wherein, in the aforementioned general formula (4), $R^9$ is methyl, $R^{10}$ is 3-methyleneoxypropylene, $R^{11}$ and $R^{12}$ are hydrogen atoms, $R^{13}$ and $R^{14}$ are acrylic, f is 1.5, and g is 2.5. The analysis results are described below. It should be noted that this solid is referred to as siloxane compound C8.
Analysis Results:
Epoxy equivalent: 285
Acrylic equivalent: 206
$^1$H-NMR: 0.09 ppm (12H, Si—CH$_3$), 3.0 to 3.2 ppm (7.56H, oxirane ring moiety), 5.7 to 6.5 ppm (6.0H, acrylic moiety)

Production Example 10

Production of Siloxane Compound C9

The same operation as in Production Example 6 was performed except that 184 g (0.25 mol) of the siloxane compound C'1 obtained in Production Example 5 was used in place of 174 g (0.25 mol) of the siloxane compound C1 in Production Example 6, thus obtaining a reaction product. From analysis results, it was verified that the obtained reaction product was a siloxane compound having a structure represented by the following formula. The analysis results are described below. It should be noted that this siloxane compound is referred to as siloxane compound C9.

[Chemical Formula 36]

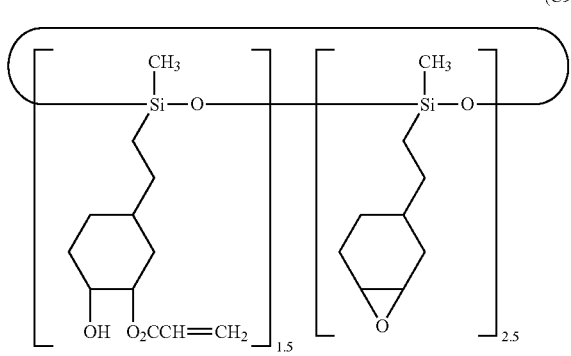

(C9)

Analysis Results:
Epoxy equivalent: 270
Acrylic equivalent: 540
$^1$H-NMR: 0.09 ppm (12H, Si—CH$_3$), (4.46H, acrylic moiety)

Examples 1 to 17 and Comparative Examples 1 to 13

Production and Evaluation of Photocurable Resin Compositions of Present Invention and Comparative Compositions Photocurable compositions of Examples 1 to 17 and Comparative Examples 1 to 13 were prepared by using the following A1 and A2 as component (A), the following B1 and B2 as component (B), C1 to C9 obtained in the aforementioned Production Examples 1 to 4 and 6 to 10, C'1 obtained in Production Example 5, and the following C'2 and C'3 as component (C), the following D1 as component (D), the following E1 as component (E), and the following F1 as component (F), and blending the aforementioned ingredients in proportions as indicated in Tables 1 and 2 below, and then filtering the mixture.

It should be noted that in Tables 1 and 2, the numerical values in parentheses are the respective contents (parts by mass).
Component (A):
A1: Dipentaerythritol hexaacrylate
A2: Pentaerythritol triacrylate
Component (B):

[Chemical Formula 37]

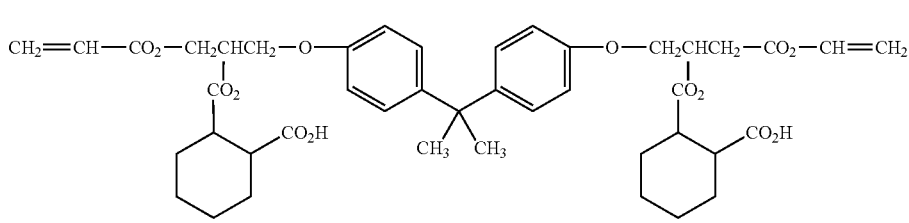

B1

[Chemical Formula 38]

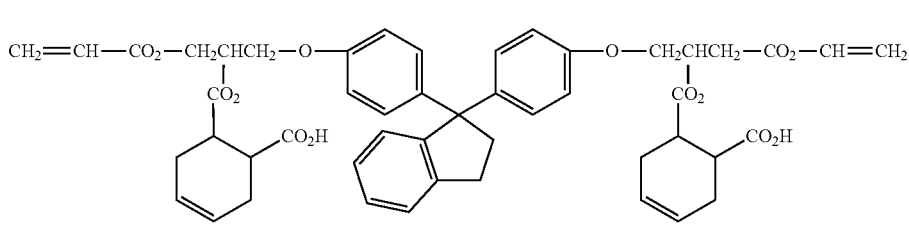

B2

Component (C) (comparative product of component (C)):
C'2:

[Chemical Formula 39]

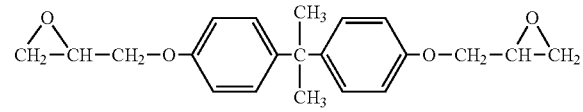

C'3: Phenol novolac-type epoxy resin (product by DIC Corporation; product name: EPICLON N-730A; epoxy equivalent: 175)
Component (D):
D1:
1-{4-(2-hydroxyethoxyphenylthio)phenyl}-1,2-propanedione-2-(O-acetyloxime)
Component (E):
E1: Equimolar mixture of 2-methacryloxyethylphosphate and bis(2-methacryloxyethyl)phosphate
Component (F):
F1: Propylene glycol monomethyl ether acetate
F2: Propylene glycol monomethyl ether Adhesion Tests and Scratch Resistance Test:

A 10×10 cm glass substrate or ITO vapor-deposited glass substrate (ITO substrate) was coated with a photocurable resin composition according to one of Examples 1 to 17 or Comparative Examples 1 to 13 by spin coating such that the thickness of the composition after solvent evaporation becomes 5 μm, and, after evaporating the solvent, the substrate was pre-baked for 1 minute at 90° C. Next, the substrate was irradiated with 120 mJ/cm$^2$ of ultraviolet rays (in terms of exposure at a wavelength of 365 nm) by a high-pressure mercury-vapor lamp, and then, the composition was cured by post-baking at 230° C. for 30 minutes. Each of the test pieces was used to conduct adhesion tests (heat-resistant adhesion test and humidity-resistance adhesion test) and a scratch resistance test according to the methods described below. The results are shown in Tables 3 and 4.

1. Adhesion Tests

The adhesion of the cured film to the substrate was evaluated in compliance with JIS K5600-5-6 (Methods for Testing Coatings in General; Part 5: Mechanical Properties of Coating Films; Chapter 6: Adhesion (Cross-cut Method)). It should be noted that the cut interval was 1 mm. Further, the evaluation results are indicated in six levels on a scale from 0 to 5, wherein a smaller number indicates higher adhesiveness.

TABLE 1

| | | Component (A) | Component (B) | Component (C) | Component (D) | Component (E) | Component (F) |
|---|---|---|---|---|---|---|---|
| Examples | 1 | A1 (65) | B1 (14) | C1 (10) | D1 (3) | E1 (4) | F1 (50) |
| | 2 | A1 (60) | B1 (14) | C1 (15) | D1 (3) | E1 (4) | F1 (50) |
| | 3 | A1 (65) | B2 (14) | C1 (10) | D1 (3) | E1 (4) | F1 (50) |
| | 4 | A1 (70) | B2 (14) | C1 (5) | D1 (3) | E1 (4) | F1 (50) |
| | 5 | A1 (65) | B1 (14) | C2 (10) | D1 (3) | E1 (4) | F1 (50) |
| | 6 | A1 (65) | B2 (14) | C2 (10) | D1 (3) | E1 (4) | F1 (50) |
| | 7 | A1 (65) | B1 (14) | C3 (10) | D1 (3) | E1 (4) | F1 (50) |
| | 8 | A1 (65) | B1 (14) | C4 (10) | D1 (3) | E1 (4) | F1 (50) |
| | 9 | A1 (78) | B1 (10) | C5 (10) | D1 (2) | — | F1 (50), F2 (10) |
| | 10 | A1 (73) | B1 (10) | C5 (10) | D1 (2) | E1 (5) | F1 (50), F2 (10) |
| | 11 | A1 (73) | B2 (10) | C5 (10) | D1 (2) | E1 (5) | F1 (50), F2 (10) |
| | 12 | A1 (68) | B2 (10) | C1 (5), C5 (10) | D1 (2) | E1 (5) | F1 (50), F2 (10) |
| | 13 | A1 (68) | B2 (10) | C5 (10), C1' (5) | D1 (2) | E1 (5) | F1 (50), F2 (10) |
| | 14 | A1 (78) | B1 (10) | C6 (10) | D1 (2) | E1 (5) | F1 (50), F2 (10) |
| | 15 | A1 (78) | B1 (10) | C7 (10) | D1 (2) | E1 (5) | F1 (50), F2 (10) |
| | 16 | A1 (78) | B1 (10) | C8 (10) | D1 (2) | E1 (5) | F1 (50), F2 (10) |
| | 17 | A1 (78) | B1 (10) | C9 (10) | D1 (2) | E1 (5) | F1 (50), F2 (10) |

TABLE 2

| | | Component (A) | Component (B) | Component (C) | Component (D) | Component (E) | Component (F) |
|---|---|---|---|---|---|---|---|
| Comparative Examples | 1 | A1 (65) | B1 (14) | — | D1 (3) | E1 (4) | F1 (50) |
| | 2 | A1 (65) | B2 (14) | — | D1 (3) | E1 (4) | F1 (50) |
| | 3 | A2 (65) | B1 (14) | — | D1 (3) | E1 (4) | F1 (50) |
| | 4 | A2 (65) | B2 (14) | — | D1 (3) | E1 (4) | F1 (50) |
| | 5 | A1 (65) | B1 (14) | C'2 (10) | D1 (3) | E1 (4) | F1 (50) |
| | 6 | A1 (65) | B2 (14) | C'2 (10) | D1 (3) | E1 (4) | F1 (50) |
| | 7 | A1 (65) | B1 (14) | C'1 (10) | D1 (3) | E1 (4) | F1 (50) |
| | 8 | A1 (65) | B2 (14) | C'1 (10) | D1 (3) | E1 (4) | F1 (50) |
| | 9 | A1 (65) | B2 (14) | C'3 (10) | D1 (3) | E1 (4) | F1 (50) |
| | 10 | A1 (88) | B1 (10) | — | D1 (2) | — | F1 (50), F2 (10) |
| | 11 | A1 (83) | B1 (10) | — | D1 (2) | E1 (5) | F1 (50), F2 (10) |
| | 12 | A1 (83) | B2 (10) | — | D1 (2) | E1 (5) | F1 (50), F2 (10) |
| | 13 | A1 (78) | B2 (10) | C'1 (5) | D1 (2) | E1 (5) | F1 (50), F2 (10) |

1-1. Heat-resistant Adhesion Test

Each of the glass substrate test pieces and ITO substrate test pieces was heated for 2 hours in a constant-temperature oven at 230° C., and then the adhesiveness was evaluated according to the method described in Item 1 above.

1-2. Humidity-resistance Adhesion Test

Each of the glass substrate test pieces and ITO substrate test pieces was placed for 3 hours in a high-pressure constant-temperature constant-humidity oven at 121° C., 2 atmospheres, and a relative humidity of 100%, and then the adhesiveness was evaluated according to the method described in Item 1 above.

2. Scratch Resistance Test

For each glass substrate test piece, the scratch hardness of the cured film was measured in compliance with JIS K5600-5-4 (Methods for Testing Coatings in General; Part 5: Mechanical Properties of Coating Films; Chapter 4: Scratch Hardness (Pencil Hardness Method)). It should be noted that the evaluation results indicate higher scratch resistance in the order of 6H, 5H, 4H, 3H, 2H, and H.

Developability Test:

A 10×10 cm glass substrate was coated with a photocurable resin composition according to one of Examples 1 to 17 or Comparative Examples 1 to 13 by spin coating such that the thickness of the composition after solvent evaporation becomes 5 μm, and, after evaporating the solvent, the substrate was pre-baked for 1 minute at 90° C. A photomask provided with lines and spaces, with line widths of 20 μm, 25 μm, 30 μm, 35 μm, and 40 μm (ten lines each), was applied to the substrate, and the substrate was irradiated with 120 mJ/cm$^2$ of ultraviolet rays (in terms of exposure at a wavelength of 365 nm) by a high-pressure mercury-vapor lamp. Then, the substrate was immersed in 2.38% tetraethylammonium hydroxide for 30 seconds to develop. After development, the substrate was rinsed with pure water, and post-baked at 230° C. for 30 minutes. The "resolution" refers to the smallest line width at which a pattern was formed without line disconnection/interruption. The "film reduction amount" refers to a value found by: cutting the test piece; measuring the pattern height at the cross section of the pattern by using an electron microscope; and subtracting the pattern height from the initial film thickness (5 μm). The results are shown in Tables 3 and 4.

TABLE 3

| | | Heat-resistant adhesion test | | Humidity-resistant adhesion test | | Scratch resistance test | Developability test | |
|---|---|---|---|---|---|---|---|---|
| | | Glass substrate | ITO substrate | Glass substrate | ITO substrate | | Resolution (μm) | Film reduction amount (μm) |
| Examples | 1 | 0 | 0 | 0 | 0 | 3H | 20 | 0.8 |
| | 2 | 0 | 0 | 0 | 0 | 3H | 20 | 0.6 |
| | 3 | 0 | 0 | 0 | 0 | 3H | 20 | 0.7 |
| | 4 | 0 | 0 | 0 | 0 | 4H | 20 | 0.5 |
| | 5 | 0 | 0 | 0 | 0 | 3H | 20 | 0.7 |
| | 6 | 0 | 0 | 0 | 0 | 3H | 20 | 0.5 |
| | 7 | 0 | 0 | 1 | 0 | 3H | 20 | 0.6 |
| | 8 | 0 | 0 | 0 | 1 | 3H | 20 | 0.5 |
| | 9 | 0 | 0 | 0 | 0 | 4H | 40 | 0.5 |
| | 10 | 0 | 0 | 0 | 0 | 4H | 35 | 0.4 |
| | 11 | 0 | 0 | 0 | 0 | 4H | 30 | 0.4 |
| | 12 | 0 | 0 | 0 | 0 | 4H | 20 | 0.2 |
| | 13 | 0 | 0 | 0 | 0 | 4H | 25 | 0.1 |
| | 14 | 0 | 0 | 0 | 0 | 4H | 30 | 0.2 |
| | 15 | 0 | 0 | 0 | 1 | 4H | 40 | 0.6 |
| | 16 | 0 | 0 | 0 | 0 | 4H | 35 | 0.2 |
| | 17 | 0 | 0 | 1 | 1 | 4H | 40 | 0.3 |

TABLE 4

| | | Heat-resistant adhesion test | | Humidity-resistant adhesion test | | Scratch resistance test | Developability test | |
|---|---|---|---|---|---|---|---|---|
| | | Glass substrate | ITO substrate | Glass substrate | ITO substrate | | Resolution (μm) | Film reduction amount (μm) |
| Comparative Examples | 1 | 2 | 2 | 5 | 5 | 4H | 20 | 1.6 |
| | 2 | 0 | 0 | 5 | 5 | 4H | 20 | 1.3 |
| | 3 | 0 | 0 | 2 | 3 | H | 25 | 1.1 |
| | 4 | 0 | 0 | 3 | 3 | H | 25 | 1.2 |
| | 5 | 0 | 0 | 5 | 5 | 3H | 40 | 1.3 |
| | 6 | 0 | 0 | 3 | 3 | 3H | 35 | 0.9 |
| | 7 | 1 | 0 | 3 | 1 | 3H | 40 | 1.1 |
| | 8 | 0 | 0 | 3 | 2 | 4H | 40 | 1.4 |
| | 9 | 0 | 1 | 1 | 3 | 3H | 20 | 1.3 |
| | 10 | 3 | 4 | 3 | 4 | 4H | 40 | 1.3 |
| | 11 | 3 | 3 | 3 | 3 | 4H | 40 | 1.2 |
| | 12 | 3 | 3 | 3 | 5 | 4H | 35 | 1.4 |
| | 13 | 2 | 4 | 3 | 5 | 4H | 30 | 0.6 |

As is clear from the results shown in Tables 3 and 4 above, it is understood that the cured films prepared from the photocurable resin compositions according to the present invention have both excellent adhesiveness to glass substrates and ITO vapor-deposited glass substrates and high scratch resistance.

The invention claimed is:

1. A siloxane compound represented by the following general formula (4):

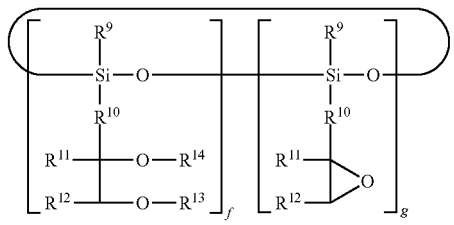

(4)

wherein $R^9$ represents a $C_{1-4}$ alkyl group or a $C_{6-10}$ aryl group; $R^{11}$ represents a hydrogen atom or a methyl group; $R^{13}$ represents an acrylic group or a methacrylic group; $R^{14}$ represents a hydrogen atom, an acrylic group, a methacrylic group, or a residue in which one hydroxyl group has been removed from a dibasic acid; $R^{10}$ and $R^{12}$ are bonded to form a cyclohexyl structure, $R^{10}$ represents a trivalent or tetravalent linking group, and $R^{12}$ represents a methylene group; f represents a number from 1 to 6; and g represents a number from 0 to 5 that makes f+g take a number from 3 to 6.

2. A photocurable resin composition comprising (A) a polyol acrylate compound, (B) a compound including, in the molecule thereof, an acrylic or methacrylic group and a carboxyl group, (C) a siloxane compound represented by the following formula (4) and (D) a photoradical generating agent:

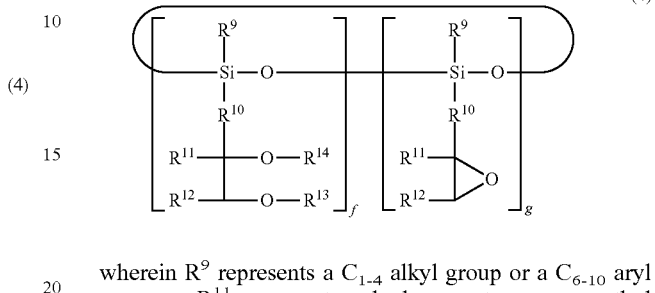

(4)

wherein $R^9$ represents a $C_{1-4}$ alkyl group or a $C_{6-10}$ aryl group; $R^{11}$ represents a hydrogen atom or a methyl group; $R^{13}$ represents an acrylic group or a methacrylic group; $R^{14}$ represents a hydrogen atom, an acrylic group, a methacrylic group, or a residue in which one hydroxyl group has been removed from a dibasic acid; $R^{10}$ and $R^{12}$ are bonded to form a cyclohexyl structure, $R^{10}$ represents a trivalent or tetravalent linking group, and $R^{12}$ represents a methylene group; f represents a number from 1 to 6; and g represents a number from 0 to 5 that makes f+g take a number from 3 to 6.

3. The photocurable resin composition according to claim 1, further comprising (E) an acrylate phosphate compound.

* * * * *